(12) United States Patent
Hinata et al.

(10) Patent No.: US 12,279,476 B2
(45) Date of Patent: Apr. 15, 2025

(54) LIGHT EMITTING DEVICE, EXPOSURE SYSTEM, IMAGING DISPLAY DEVICE, IMAGING DEVICE, ELECTRONIC DEVICE, AND LIGHTING DEVICE

(71) Applicant: CANON KABUSHIKI KAISHA, Tokyo (JP)

(72) Inventors: Shoma Hinata, Ebina (JP); Yojiro Matsuda, Kawasaki (JP); Hiroaki Sano, Yokohama (JP); Hidekazu Takahashi, Zama (JP); Yoshihito Harada, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 218 days.

(21) Appl. No.: 16/922,526

(22) Filed: Jul. 7, 2020

(65) Prior Publication Data

US 2021/0014393 A1   Jan. 14, 2021

(30) Foreign Application Priority Data

Jul. 12, 2019   (JP) .................................. 2019-130386
Feb. 28, 2020  (JP) .................................. 2020-033820

(51) Int. Cl.
*H10K 50/858*   (2023.01)
*G02B 3/00*     (2006.01)
*G02B 5/28*     (2006.01)
*H10K 59/121*   (2023.01)

(52) U.S. Cl.
CPC ......... *H10K 50/858* (2023.02); *G02B 3/0037* (2013.01); *G02B 5/286* (2013.01); *H10K 59/121* (2023.02)

(58) Field of Classification Search
CPC .......................... H01L 27/326; H01L 51/5275
See application file for complete search history.

(56) References Cited

U.S. PATENT DOCUMENTS

| 10,153,332 | B2 | 12/2018 | Ohsawa |
| 2004/0150329 | A1 | 8/2004 | Asai |
| 2010/0182222 | A1 | 7/2010 | Ichihashi |
| 2014/0312319 | A1 | 10/2014 | Kim |
| 2016/0087018 | A1 | 3/2016 | Shim |
| 2017/0133637 | A1 | 5/2017 | Kim |
| 2017/0263691 | A1 | 9/2017 | Seo |
| 2020/0357854 | A1* | 11/2020 | Koshihara ............. H01L 27/326 |

(Continued)

FOREIGN PATENT DOCUMENTS

| CN | 102376742 A | * | 3/2012 | ......... H01L 27/3244 |
| CN | 102479799 A |   | 5/2012 | |
| CN | 109216584 A |   | 1/2019 | |

(Continued)

*Primary Examiner* — Mariceli Santiago
(74) *Attorney, Agent, or Firm* — Canon U.S.A., Inc. IP Division

(57) ABSTRACT

A light emitting device including a first light emitting element disposed on a main surface of a substrate, and a first lens fixed to the substrate and overlapping a center of a first light-emission region of the first light emitting element in plan view in a direction perpendicular to the main surface. In the plan view in the direction perpendicular to the main surface, the center of the first light-emission region and a center of the first lens are separated from each other by a first distance in a direction parallel to the main surface.

22 Claims, 17 Drawing Sheets

(56) References Cited

U.S. PATENT DOCUMENTS

2021/0057678 A1 2/2021 Motoyama

FOREIGN PATENT DOCUMENTS

| | | | | |
|---|---|---|---|---|
| CN | 109427859 A | 3/2019 | | |
| CN | 109994512 A | 7/2019 | | |
| CN | 112216730 A * | 1/2021 | ......... | H01L 27/3218 |
| CN | 112652728 A * | 4/2021 | ......... | G02B 27/0172 |
| JP | 2007253503 A | 10/2007 | | |
| JP | 2007-335723 A | 12/2007 | | |
| JP | 2009051200 A | 3/2009 | | |
| JP | 2009540519 A | 11/2009 | | |
| JP | 2010123458 A | 6/2010 | | |
| JP | 2010160343 A | 7/2010 | | |
| JP | 2010192189 A | 9/2010 | | |
| JP | 2010272858 A | 12/2010 | | |
| JP | 2011118330 A | 6/2011 | | |
| JP | 2012-248453 A | 12/2012 | | |
| JP | 2013114772 A | 6/2013 | | |
| JP | 2013251173 A | 12/2013 | | |
| JP | 2015-012488 A | 1/2015 | | |
| JP | 2015-187635 A | 10/2015 | | |
| JP | 2016-118675 A | 6/2016 | | |
| JP | 2016186949 A | 10/2016 | | |
| JP | 2017079243 A | 4/2017 | | |
| JP | 2017-181831 A | 10/2017 | | |
| JP | 2018-106167 A | 7/2018 | | |
| KR | 10-2011-0061739 A | 6/2011 | | |
| WO | 2012/088260 A2 | 6/2012 | | |
| WO | 2019/151278 A1 | 8/2019 | | |
| WO | 2019159641 A1 | 8/2019 | | |
| WO | WO-2020111101 A1 * | 6/2020 | ......... | G02B 19/0014 |

\* cited by examiner

LIGHT EMITTING DEVICE, EXPOSURE SYSTEM, IMAGING DISPLAY DEVICE, IMAGING DEVICE, ELECTRONIC DEVICE, AND LIGHTING DEVICE

BACKGROUND OF THE INVENTION

Field of the Invention

The present disclosure relates to a light emitting device, an exposure system, an imaging display device, an imaging device, an electronic device, and a lighting device.

Description of the Related Art

An organic EL element is a light emitting element including a pair of electrodes and an organic compound layer that is disposed between the pair of electrodes and that includes a light emitting layer. A light emitting device in which organic EL elements are used has excellent features such as surface emission characteristics and lightweight characteristics. Taking advantage of this features, such a light emitting device has attracted attention as a light emitting device to be used in an imaging display device, such as a head-mounted display, an exposure device of an exposure system for an electrophotographic printer, and the like.

When a light emitting device is used as a display device or an exposure device, light that is emitted from the light emitting device is utilized through various optical systems. The optical systems utilize only a portion of the light emitted from the light emitting device. It is thus considered that, by improving light utilization efficiency in the optical systems, it is possible to reduce power consumption of the light emitting device.

Japanese Patent Laid-Open No. 2012-248453 discloses a configuration in which a microlens is disposed on an organic EL element for the purpose of increasing emission intensity in the front direction.

In the light emitting device described in Japanese Patent Laid-Open No. 2012-248453, there is a case where light utilization efficiency when the light emitting device is combined with an optical system is not sufficient.

SUMMARY OF THE INVENTION

One aspect of the present disclosure relates to a light emitting device including: a first light emitting element disposed on a main surface of a substrate; and a first lens that is fixed to the substrate to be in contact with the first light emitting element and that overlaps the center of a first light-emission region of the first light emitting element in plan view in a direction perpendicular to the main surface. In the plan view in the direction perpendicular to the main surface, the center of the first light-emission region and the center of the first lens are separated from each other by a first distance in a direction parallel to the main surface.

Another aspect relates to a light emitting device including: a first light emitting element, a second light emitting element, and a third light emitting element that are disposed on a main surface of a substrate; a first lens that overlaps the center of a first light-emission region of the first light emitting element in plan view in a direction perpendicular to the main surface; a second lens that overlaps the center of a second light-emission region of the second light emitting element; and a third lens that overlaps the center of a third light-emission region of the third light emitting element. A first pixel including the first light emitting element, a second pixel including the second light emitting element, and a third pixel including the third light emitting element each emit light of a first color. In the pixels that each emit the light of the first color, the second light emitting element is disposed between the first light emitting element and the third light emitting element and is adjacent to the first light emitting element and the third light emitting element in the plan view in the direction perpendicular to the main surface. In the plan view, a distance between the center of the second light-emission region and the vertex of the second lens is larger than a difference between a distance between the vertex of the first lens and the vertex of the second lens and a distance between the vertex of the second lens and the vertex of the third lens.

Further features of the present disclosure will become apparent from the following description of exemplary embodiments with reference to the attached drawings.

DESCRIPTION OF THE EMBODIMENTS

Figure 1A:
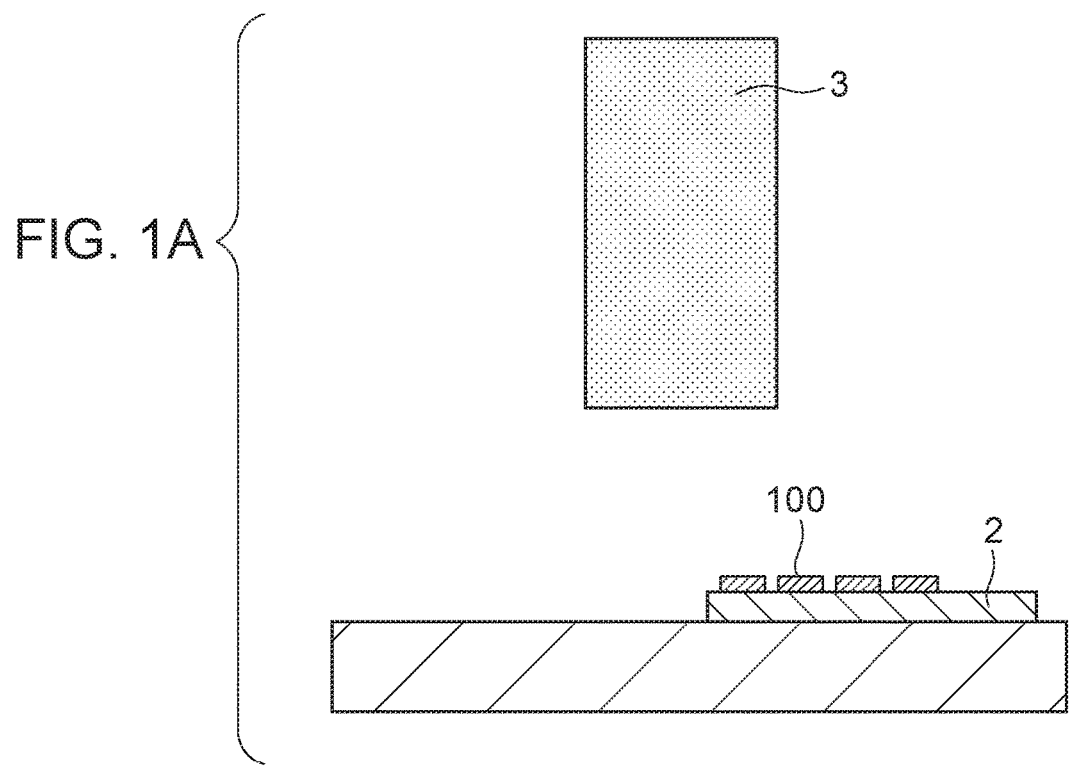
FIG. 1A is a sectional schematic diagram describing an example of a configuration of a portion of an exposure system.
Figure 1B:
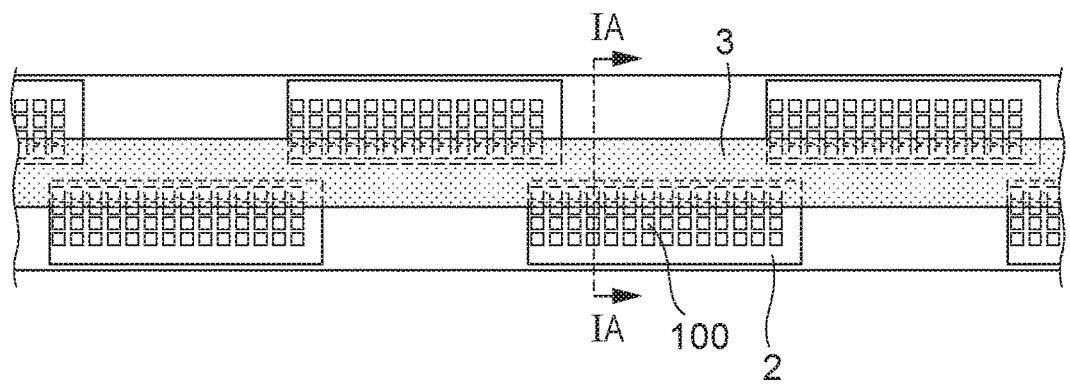
FIG. 1B is a planar schematic diagram.

FIGS. 1A and 1B each illustrate a configuration example of an exposure system in which light that has been emitted from a light emitting device that uses organic EL elements as light emitting elements is imaged on a photoreceptor through an image-forming lens array. FIG. 1B is a planar schematic diagram. FIG. 1A is a sectional diagram along line IA-IA of FIG. 1B.

As illustrated in FIG. 1B, in a light emitting device 2 in which a chip including a plurality of light emitting elements 100 are staggered, pixels including the light emitting elements are not disposed directly below an image-forming lens array 3. When, for the purpose of exposing the same point on a photoreceptor a plurality of times, a plurality of pixels are arranged as illustrated in FIGS. 1A and 1B in a sub-scanning direction, the further pixels are disposed on the outer side, the larger the angle at which light travels from the pixels toward the image-forming lens array. In such a case, it is considered to be possible to improve light utilization efficiency by increasing emission intensity in a direction from the pixels toward the image-forming lens array.

Figure 2:
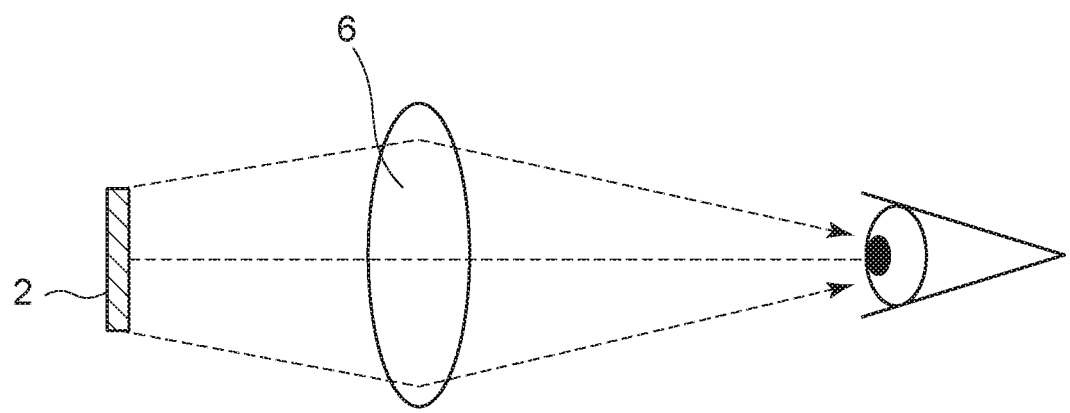
FIG. 2 is a schematic diagram illustrating a light ray of a light emitting device in a magnification optical system.

FIG. 2 illustrates an outline of a light ray when a light emitting device including organic EL elements are used in a display device that uses a magnification optical system. When a magnification optical system 6 is used for the light emitting device 2 as illustrated in FIG. 2, a light ray that travels toward a front direction with respect to a display surface is utilized in a center portion of a function region (display region). In contrast, in an outer peripheral portion of the function region, light that travels in an oblique direction with respect to the display surface is utilized. It is thus considered to be possible to improve light utilization efficiency in the outer peripheral portion of the function display region by increasing emission intensity in the oblique direction.

The inventors have led to this idea and led to a solution of disposing a microlens with the center thereof shifted from a light-emission region of a light emitting element in a direction in which emission intensity is to be desirably increased. Hereinafter, embodiments of the present disclosure will be described with reference to the drawings. Note that well-known or publicly known techniques in this technical field are applied to portions not particularly illustrated or described in the present specification. The present invention is not limited to the embodiments described below.

In the following description and the drawings, components that are common among a plurality of drawings are given common signs. Accordingly, common components are described by mutually referring to the plurality of drawings, and description of components, materials, methods, effects, and the like having common signs is omitted, as appropriate.

First Embodiment

Hereinafter, a configuration example of a light emitting device of the present embodiment will be described. In the present embodiment, an example of an exposure system that forms an image by irradiating a photoreceptor through an image-forming lens array with light emitted from the light emitting device will be described.

The light emitting device according to the present embodiment includes a light emitting element disposed on a main surface of a substrate, and a microlens that is fixed to the substrate and that light from a light-emission region of the light emitting element enters. In plan view in a direction perpendicular to the main surface of the substrate, the center of the light-emission region and the center of the microlens are away from each other in a direction parallel to the main surface.

A plurality of the light-emission regions and a plurality of the microlenses may be disposed, and, in the plan view in the direction perpendicular to the main surface, for example, a distance between the center of a second light-emission region and the center of a second microlens may be smaller than a distance between the center of a first light-emission region and the center of a first microlens in the direction parallel to the main surface.

In the direction parallel to the main surface, a distance between the center of the first microlens and the center of the second microlens and a distance between the center of the first light-emission region and the center of the second light-emission region may differ from each other.

Further, for example, the light emitting device according to the present embodiment includes first to third light emitting elements disposed on the main surface of the substrate, and first to third microlenses that light from light-emission regions of the first to third light emitting elements enters, respectively. First to third pixels including the first to third light emitting elements, respectively, each emit light that belongs to the same color. When only the first to third pixels are viewed, the second light emitting element is disposed between the first light emitting element and the third light emitting element so as to be adjacent thereto in plan view in a direction perpendicular to the main surface.

In such a configuration, in the plan view in the direction perpendicular to the main surface, a difference between a distance between the vertex of the first microlens and the vertex of the second microlens and a distance between the vertex of the second microlens and the vertex of the third microlens is represented by a pitch difference D.

Here, in the light emitting device of the present embodiment, a distance between the center of the second light-emission region and the vertex of the second microlens is larger than the pitch difference D in the plan view.

In the plan view in the direction perpendicular to the main surface, the distance between the center of the second light-emission region and the vertex of the second microlens may be smaller than a distance between the center of the first light-emission region and the vertex of the first microlens. The distance here denotes a distance (shortest distance) in a direction passing through the vertex of the first microlens and the vertex of the second microlens.

In the direction parallel to the main surface, the pitch of the microlenses and the pitch of the light-emission regions may differ from each other. For example, a distance between the vertex of the first microlens and the vertex of the second microlens and a distance between the center of the first light-emission region and the center of the second light-emission region may differ from each other.

Figure 3A:
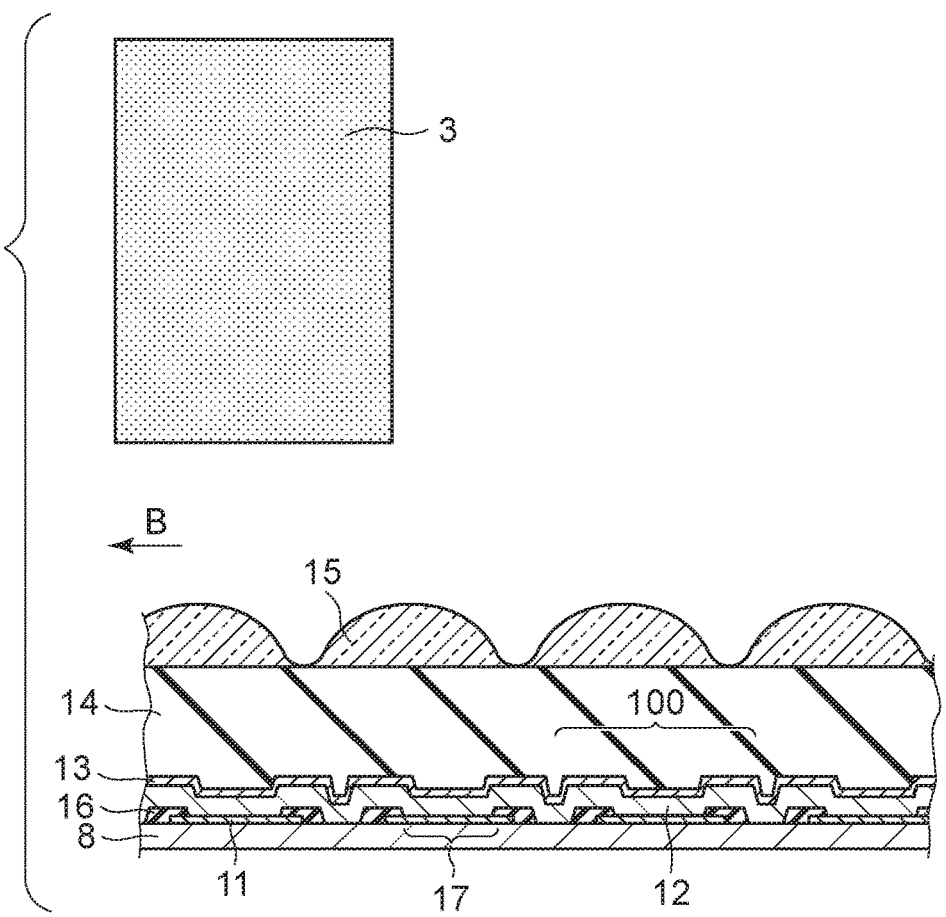
FIG. 3A is a sectional diagram illustrating an example of a portion of an exposure system in which a light emitting device is used.
Figure 3B:
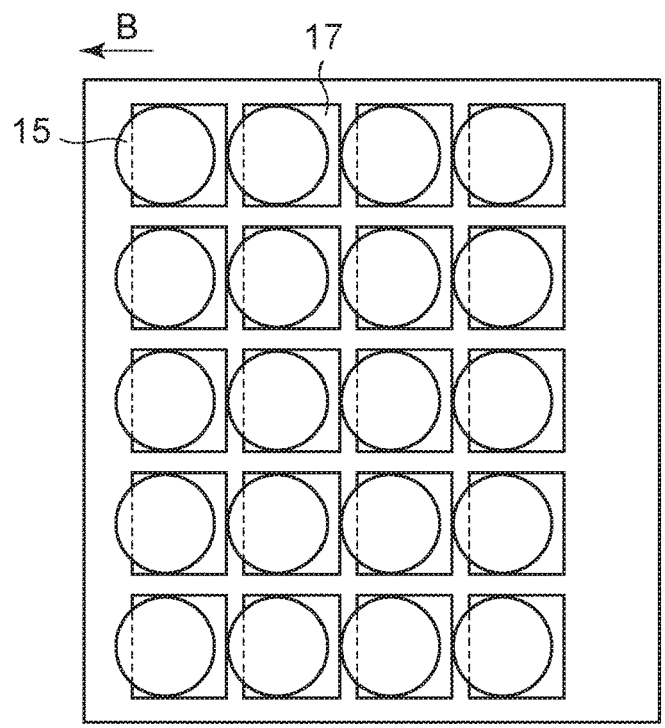
FIG. 3B is a schematic view in plan view.

A more specific configuration example will be described with reference to the drawings. FIG. 3A is a sectional diagram illustrating an example of a portion of an exposure system in which the light emitting device of the present embodiment is used. FIG. 3B is a schematic diagram in plan view. The plan view is an arrangement in which the light emitting device is viewed in a direction (the normal direction of the main surface) perpendicular to the main surface of the substrate. Here, a plan view in the direction perpendicular to the main surface of the substrate is illustrated.

The light emitting device includes the light emitting elements 100. The light emitting elements 100 on a substrate 8 each include a first electrode 11 disposed on the main surface of the substrate 8, an organic layer 12 that includes a light emitting layer, and a second electrode 13 disposed on the first electrode 11 with the organic layer 12 held therebetween. The light emitting device also includes an insulating layer 16 that covers end portions of the first electrode 11 to have an opening on the first electrode 11 and that functions as a bank, a protective layer 14 disposed on the second electrode 13, and microlenses 15. The light emitted from the light emitting elements enters the microlenses 15.

In the present embodiment, the microlenses 15 are disposed to be shifted in a direction B toward the image-forming lens array 3 with respect to light-emission regions 17 of the light emitting elements 100 in plan view. Employing this configuration increases, compared with when no microlens is formed and when the microlenses and the light-emission regions are formed to overlap each other in plan view, emission intensity in the direction toward the image-forming lens array 3 and improves utilization efficiency of light that is emitted by the light emitting layer. Details of effects will be described later. The light-emission regions of the light emitting elements denote portions where the first electrode 11, the light emitting layer, and the second electrode 13 are layered in the opening of the insulating layer 16 in the plan view.

A state in which a microlens and a light-emission region are shifted from each other in each light emitting element denotes a state in which the center of the microlens and the center of the light-emission region do not overlap each other in plan view and are away (or separated) from each other by a certain distance. The center of the microlens is the center of gravity of a shape (outer shape) constituted by a line connecting the end portions of the microlens in plan view. The end portions of the microlens are locations where a height in a Z-direction is the lowest in the cross-sectional view of the microlens. In FIG. 3A, the cross-section of each microlens 15 is a spherical shape (the spherical shape including a partially-missing spherical shape and a hemispherical shape). In this case, the center of the microlenses 15 and the vertex of the microlenses 15 are coincident with each other.

In the present embodiment, each microlens 15 is disposed to be shifted with respect to a light-emission region. In other words, in plan view with respect to a surface of the substrate 8 on which the light emitting elements 100 are disposed, the center of the microlens 15 and the center of the light-emission region are away from each other by a certain distance (not coincident with each other). Due to the sectional shape of the microlens 15 being spherical here, the vertex of the microlens 15 and the center of the light-emission region are also away from each other by a certain distance.

In the present embodiment, the pitch (distance between the centers of mutually adjacent microlenses in the plan view with respect to the surface of the substrate 8 on which the light emitting elements 100 are disposed) of the microlenses 15 is constant. The pitch (distance between the centers of the light-emission regions of the light emitting elements 100 adjacent to each other in the plan view) is also constant. Therefore, the microlenses 15 and the light-emission regions are disposed to be shifted from each other by a certain distance (shift amount).

The pitch of the light emitting elements and the pitch of the microlenses 15 are substantially equal to each other. In other words, in the present embodiment, an example in which a distance (microlens shift amount) between the center of a microlens and the center of a light-emission region in plan view is constant in each light-emission element is presented.

The pitch of the microlenses 15 can be set to 0.1 times or more and 20 times or less of the pitch of the light emitting elements. Specifically, the pitch of the light emitting elements can be set to, for example, 0.1 μm or more and 40 μm or less, and the pitch of the microlenses 15 can be set to 0.01 μm or more and 800 μm or less. In the present embodiment, a distance between the second electrode 13 of the light emitting element and the microlens 15 can be set to 0.1 μm or more and 1 mm or less.

The material of the substrate 8 is at least capable of supporting the first electrode 11, the organic layer 12, and the second electrode 13. For example, glass, plastic, silicon, and the like are usable. On the substrate 8, a switching element, such as a transistor and the like, wiring, an interlayer insulating film (not illustrated), and the like may be disposed.

The first electrode 11 may be transparent or opaque. When the first electrode 11 is opaque, a metal material in which a reflectance at an emission wavelength is 70% or more is desirable. Metals such as Al and Ag, alloys in which Si, Cu, Ni, Nd, and the like are added to these metals, and ITO, IZO, AZO, and IGZO are usable. The emission wavelength here denotes a spectral range of light emission from the organic layer 12. The first electrode 11 may be a layered electrode layered with a barrier electrode of a metal, such as Ti, W, Mo, Au, or an alloy thereof and may be a layered electrode layered with a transparent oxide film electrode of ITO, IZO, and the like, provided that the reflectance thereof is higher than a desired reflectance.

When the first electrode 11 is a transparent electrode, a configuration in which a reflective layer is further disposed on a lower portion of the first electrode 11 may be employed. As the transparent electrode, for example, ITO, IZO, AZO, IGZO, and the like are usable. For the purpose of optimizing an optical distance, which will be described later, a configuration in which an insulating film is further disposed between the reflective layer and a transparent conductive film may be employed.

The second electrode 13 is disposed on the organic layer 12 and has translucency. The second electrode 13 may be a semi-transparent material having a property (that is, semi-transparent reflectivity) of transmitting a portion of light that has reached a surface thereof while reflecting the other portion of the light.

As the material of the second electrode 13, for example, a transparent material such as a transparent conductive oxide is usable. Semi-transparent materials constituted by a single metal, such as aluminum, silver, and gold, an alkaline metal, such as lithium, cesium, and the like, an alkaline earth metal, such as magnesium, calcium, barium, and the like, or an alloy material containing these metal materials are also usable. As the semi-transparent material, in particular, an alloy containing magnesium or silver as a main component can be used. The second electrode 13 may have a layered structure including the aforementioned materials as long as having desirable transmittance. The second electrode 13 may be shared among a plurality of the light emitting elements 100.

Either the first electrode 11 or the second electrode 13 is an anode, and the other functions as a cathode. In other words, the first electrode 11 may be an anode with the second electrode 13 being a cathode or may be reverse.

The organic layer 12 is disposed on the first electrode 11 and can be formed by a publicly known technique such as an evaporation method or a spin coating method.

The organic layer 12 may be constituted by a plurality of layers. When the organic layer is an organic compound layer, the plurality of layers is, for example, one of a hole injection layer, a hole-transport layer, an electron block layer, a light emitting layer, a hole block layer, an electron transport layer, and an electron injection layer, or a combination thereof.

The light emitting layer emits light in response to a positive hole injected from the anode and an electron injected from the cathode rejoining to each other in the organic compound layer. The configuration of the light emitting layer may include a single layer or a plurality of layers. A red light emission material, a green light emission material, and a blue light emission material can be included in either of the light emitting layers. It is also possible to obtain white light by mixing light-emission colors. A light emission material having a relation of complementary colors, such as a blue light emission material and a yellow light emission material, may be included in either of the light emitting layers.

Light of a different color may be emitted by changing, for each light emitting pixel, a material included in the light emitting layer and the configuration thereof. A light emitting layer may be disposed in each of the light emitting elements. In that case, the light emitting layer may be patterned for each of the light emitting elements 100.

The light emitting device according to the present embodiment may include an element having a first reflection surface, a second reflection surface, and a light emitting layer disposed between the first reflection surface and the second reflection surface. The light emitting element described above may have this configuration. The first reflection surface may be the first electrode 11 or the reflective layer disposed between the first electrode 11 and the insulating layer.

To optimize an optical distance between the first reflection surface and a light-emission location of the organic layer 12 that includes the light emitting layer, when a phase shift with an optical path length Lr from the upper surface of the first reflection surface to the light-emission location of the organic layer 12 at the reflective layer is represented by $\phi r$, $$Lr=(2m-(\phi r/\pi))\times(\lambda/4) \quad (1)$$

where m is an integer greater than or equal to 0. The film thickness of the first electrode 11, the first reflection surface, or the organic layer 12 may be optimized to substantially satisfy the aforementioned formula (1).

When a phase shift when light of a wavelength $\lambda$ is reflected by the reflection surface is represented by $\phi s$, an optical distance Ls between the light-emission location and the second reflection surface substantially satisfies the following formula (2). In the present embodiment, m'=0.

$$Ls=(2m'-(\phi s/\pi))\times(\lambda/4)=-(\phi s/\pi)\times(\lambda/4) \quad (2)$$

Therefore, an all-layer interference L substantially satisfies the following conditions.

$$L=Lr+L=(2m-\phi/\pi)\times(\lambda/4) \quad (3)$$

Here, $\phi$ is a sum $\phi r+\phi s$ of a phase shift when light of the wavelength $\lambda$ is reflected by the first electrode 11 or by the reflective layer and the second electrode 13.

Here, the above phrase "substantially satisfies" denotes that, in the formula (1) to formula (3), a tolerance is approximately $\lambda/8$ or approximately 20 nm.

There is a case in which specifying the light-emission location of the light emitting layer is difficult. Thus, in the aforementioned configuration, the light-emission location is substituted by an interface of a function layer on the side of the first reflection surface or an interface thereof on the side of the second reflection surface. Considering the tolerance described above, even when such a substitution is performed, it is possible to achieve an effect of strengthening light.

The protective layer 14 is an insulating layer and can include an inorganic material that has translucency and that is low in permeability to oxygen and moisture from the outside. For example, the protective layer 14 can be created by using an inorganic material, such as a silicon nitride (SiN), a silicon oxynitride (SiON), silicon oxide ($SiO_x$), aluminum oxide ($Al_2O_3$), and a titanium oxide ($TiO_2$). In particular, in terms of protective performance, an inorganic material of SiN, SiON, or $Al_2O_3$ can be used. A chemical vapor deposition method (CVD method), an atomic layer deposition method (ALD method), or a sputtering method can be used to form the protective layer 14.

The protective layer 14 may have, as long as having sufficient moisture blocking performance, a single-layer structure or a layered structure in which the aforementioned materials and formation methods are combined. For example, the protective layer 14 may be a layer in which a layer of silicon nitride and a high-density layer formed by an atomic deposition method are layered. Further, the protective layer 14 may have an organic layer as long as maintaining moisture blocking performance. The organic layer is, for example, polyacrylates, polyimides, polyesters, epoxy, or the like.

The protective layer 14 may be disposed across a plurality of the light emitting elements 100.

The microlenses 15 can be formed through exposure and development processes. Specifically, a film (photoresist film) constituted by a material for forming microlenses is formed, and exposure to light and development of the photoresist film are performed by using a mask that has a continuous tone change. As such a mask, it is possible to use a gray mask or an area-tone mask that enables irradiation of an image formation surface with light having a continuous tone by varying density distribution of dots that are constituted by a light-shielding film with a resolution lower than or equal to the resolution of the exposure device.

The lens shape is adjustable by performing etch-back with respect to the microlenses formed through the exposure and development processes. As long as being a shape capable of refracting emitted light, the shape of each microlens may be spherical, or the cross-sectional shape thereof may be asymmetric.

Figure 4A:
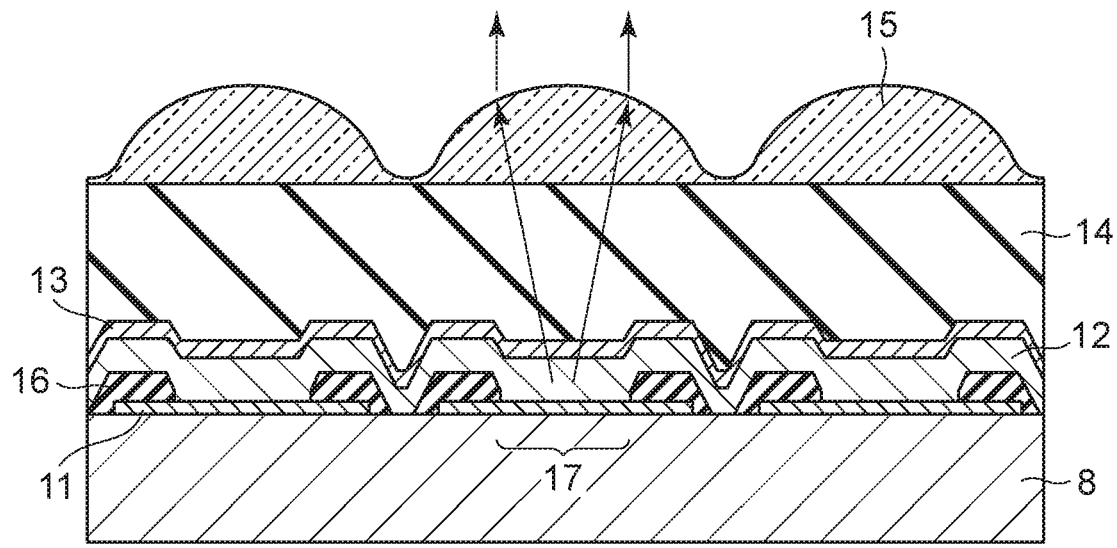
FIGS. 4A and 4B are sectional schematic diagrams each describing a relation between a light ray and an arrangement of light-emission regions and microlenses.
Figure 4B:
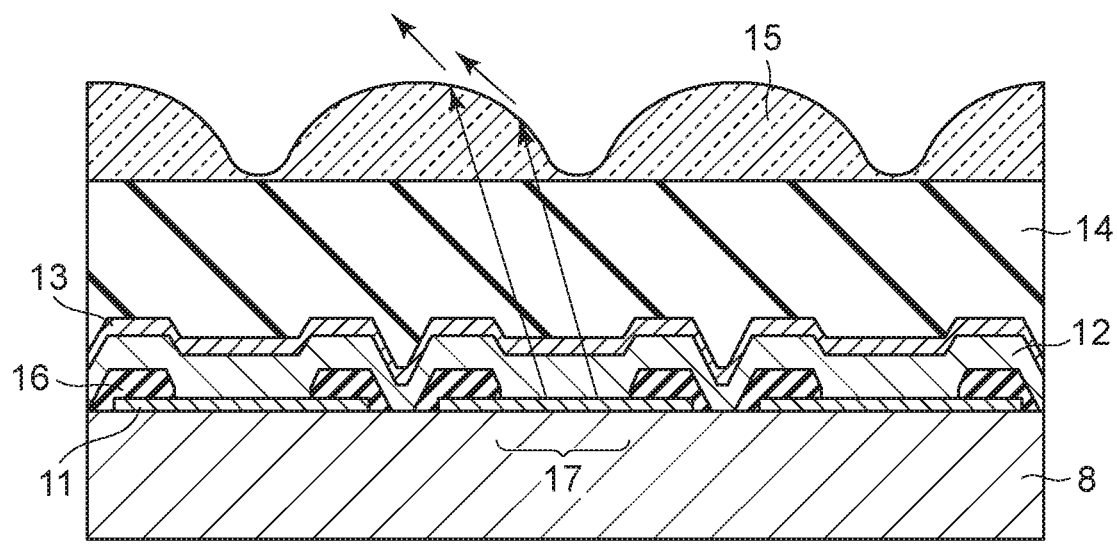

Effects of the present embodiment will be described. As illustrated in FIG. 4A, when the microlenses and the light-emission regions are arranged to overlap each other in plan view, the light emitted from the light-emission regions is condensed in the front direction by the microlenses. Therefore, compared with when the microlenses are not disposed, emission intensity in the front direction is increased. In contrast, when the microlenses are arranged to be shifted from the light-emission regions as illustrated in FIG. 4B, the light is refracted when being transmitted through the microlenses, and thus, emission intensity in a specific direction is increased.

As described above, when chips that include the light emitting elements are staggered in the exposure system, pixels that include the light emitting elements are not disposed directly below the image-forming lens array. When a plurality of pixels are arranged in the sub-scanning direction, the further the pixels are disposed on the outer side, the larger the angle at which light travels from the pixels toward the image-forming lens array. Therefore, it is possible to increase emission intensity in the direction from the pixels toward the image-forming lens array by using a light emitting device in which emission intensity in a specific direction is improved as with the present embodiment. It is thus possible to provide an exposure system in which light utilization efficiency is improved.

For example, the light emitting device used in the exposure system includes a plurality of sets of a light-mission region and a microlens that light from the light-emission region enters. In each of the plurality of sets, in a direction parallel to the surface of the substrate 8 on which the light emitting elements 100 are disposed, a direction from the center of the light-emission region toward the center of the microlens is one direction, specifically, a direction toward the image-forming lens array 3. Consequently, it is possible, for the light that is transmitted through the microlenses disposed in the function regions (light-emission regions) in which the plurality of sets are disposed, to increase emission intensity in the direction toward the image-forming lens array. Therefore, light utilization efficiency is improved.

Figure 5:
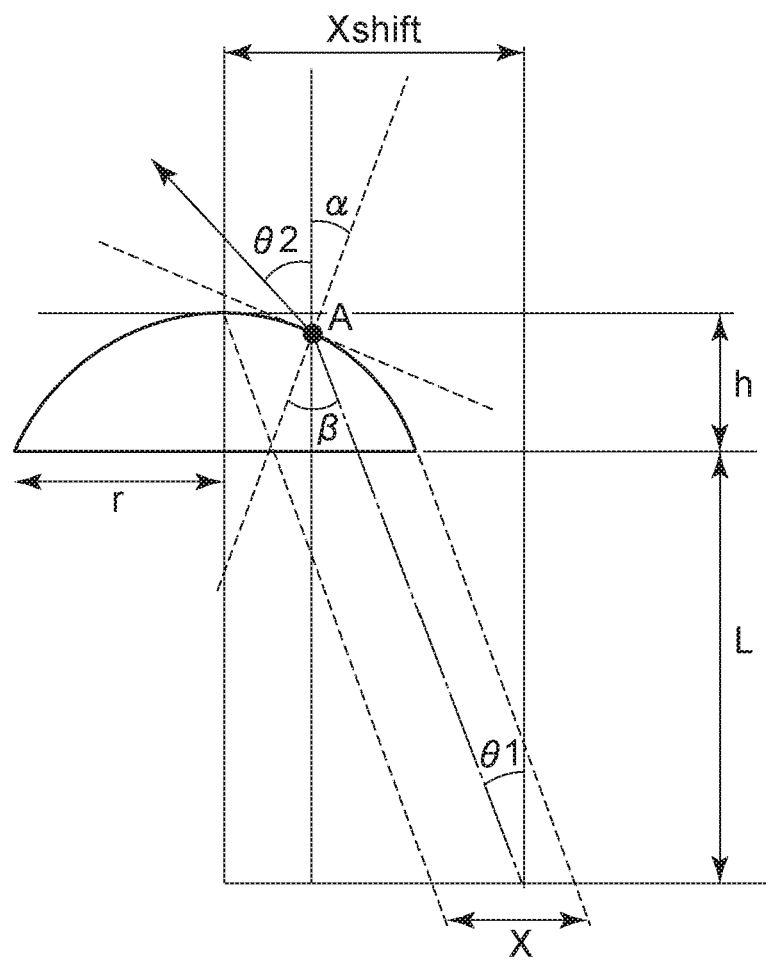
FIG. 5 is a sectional schematic diagram describing a relation between a light ray and an arrangement of light emission regions and microlenses.

FIG. 5 is a sectional diagram illustrating a relation between a light-emission region and a microlens. In FIG. 5, a microlens having a height h, a radius r, and a refractive index n is illustrated.

Light is emitted at an angle θ1 from the light-emission region, and the light is refracted by a point A of the microlens at an angle θ2. The inclination of a normal line with respect to the tangent on the surface of the microlens at the point A in this state is represented by an angle α. When α+θ1 is substituted by β, the following equation (1) is established according to the Snell's law.

$$1 \times \sin(\theta2+\alpha) = n \times \sin(\theta1+\alpha) \quad (1)$$

When the equation (1) is solved for θ1, θ1 becomes the formula (2).

$$\theta1 = \sin^{-1}\{\sin(\theta2+\alpha)/n\} - \alpha \quad (2)$$

When light from the light-emission region is intended to be emitted toward a wide angle side (to satisfy θ2>θ1) as illustrated in FIG. 5, light that enters a region in which α is positive, that is, a region on the right side of the vertex of the microlens in FIG. 5 is mainly utilized.

To effectively utilize the microlens including the end portions thereof, α<θ2 is desirably satisfied in the whole region of the microlens for the desired emission angle θ2 at which emission strength is intended to be increased.

Here, a shift amount by which the vertex of the microlens is shifted from the center of the light-emission region is represented by Xshift. To increase emission strength at the desired emission angle θ2, the angle θ1 that satisfies the aforementioned formula (2), and β are calculated for α at each of points on the microlens, and Xshift is set such that a light-emission region X is present in a direction of β of either of the points.

Actually, a protective layer and the like are present between the microlens and the light-emission region, and Xshift is thus not determined by the aforementioned formula. It is, however, considered on the basis of the aforementioned effect that emission intensity in a specific direction is improved by employing a configuration in which the microlens is disposed to be shifted from the light-emission region. Accordingly, it is considered to be possible to improve light utilization efficiency in the optical system.

FIG. 3A illustrates an example in which the microlenses 15 are formed directly on the protective layer 14 integrally (continuously) therewith. A flattening layer may be formed between the protective layer 14 and the microlenses 15 for the purpose of flattening irregularities of the protective layer 14. A color filter may be disposed between the microlenses 15 and the protective layer 14 or between the microlenses 15 and the flattening layer. Further, a color filter may be disposed on the microlenses 15.

Figure 6A:
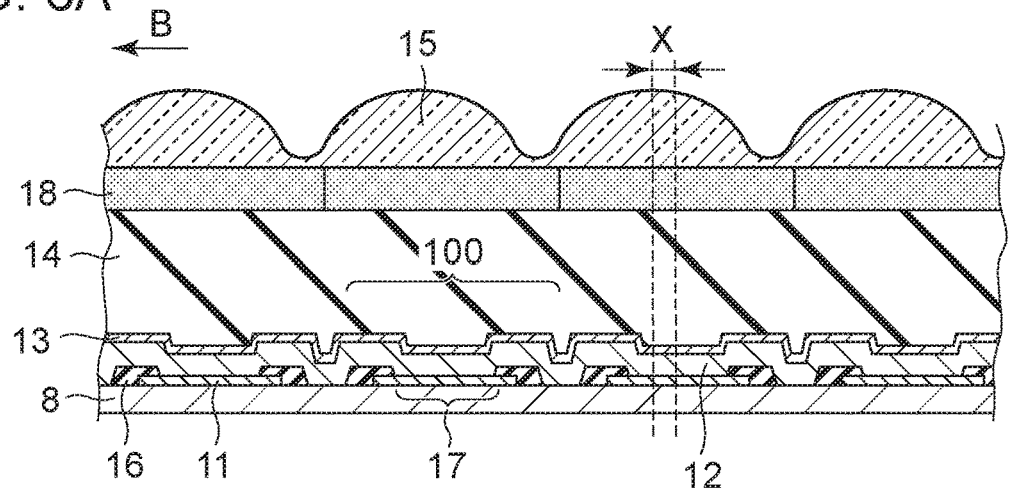
FIGS. 6A to 6C are sectional schematic diagrams each describing a modification of a light emitting device.

FIG. 6A illustrates an example in which a color filter 18 is disposed in the light emitting device illustrated in FIG. 3A. Here, an example in which a color filter is disposed between the microlenses 15 and the protective layer 14 is presented. The example illustrated here is an example in which, in the light emitting device in which pixels that respectively include red, green, and blue color filters are disposed adjacent to each other, only pixels that emit light of the same color (for example, green) are cut out.

The light emitting device of the present embodiment satisfies the following relation for, among the pixels that emit light of the same color, three pixels disposed adjacent to each other in plan view with respect to the surface of the substrate 8 on which the light emitting elements 100 are disposed. In the plan view, a distance X between the center of a light-emission region and the vertex of a microlens is larger than a difference between a distance between the vertex of a microlens 15a and the vertex of a microlens 15b and a distance between the vertex of the microlens 15b and the vertex of the microlens 15c. In FIG. 6A, the pitch of the microlenses 15 is constant. The center of the light-emission region and the center (vertex, here) of the microlens are thus disposed to be shifted from each other.

Therefore, it is possible to increase emission intensity in a specific direction and possible to improve light utilization efficiency in the optical system (the image-forming lens array 3 and the magnification optical system 6).

Figure 6B:
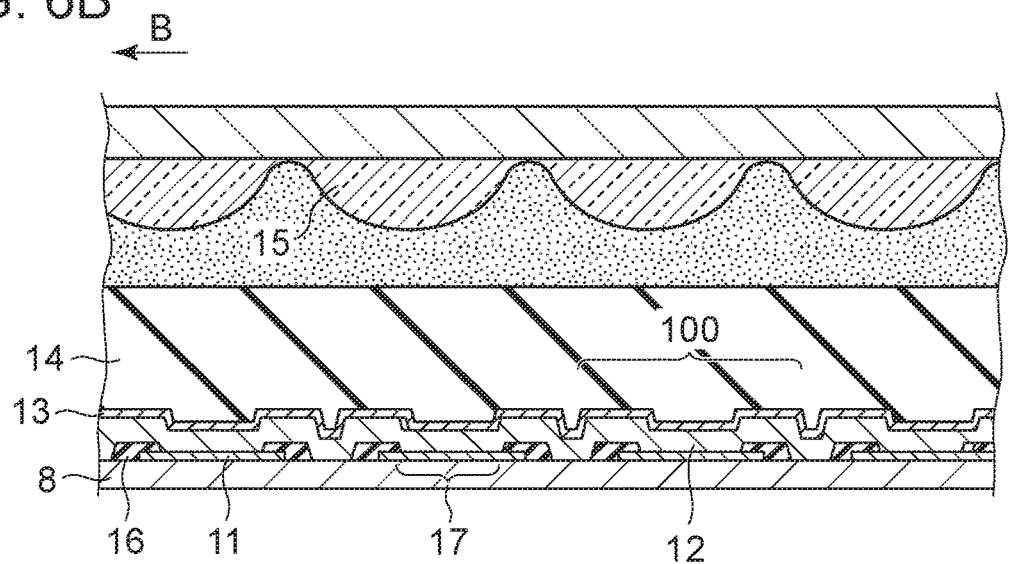

As illustrated in FIG. 6B, the microlenses 15 may be formed on a separate substrate and bonded so as to face the light emitting elements 100. For example, the microlenses 15 are fixed to the substrate 8 by an adhesive. The adhesive may be disposed between the protective layer 14 and the microlenses 15 or may be disposed between the flattening layer and the microlenses 15. A space may be disposed between the microlenses 15 and the protective layer 14 (or the flattening layer or the color filter), and the microlenses 15 may be fixed at end portions of the light emitting device to the substrate 8 by an adhesive.

Figure 6C:
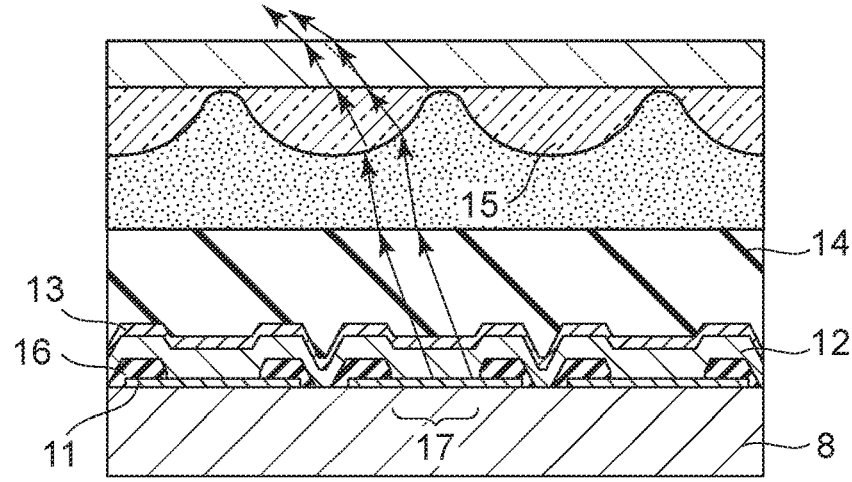

Even in this case, by disposing the microlenses to be shifted from the light-emission regions as illustrated in FIG. 6C, light is refracted when being transmitted through the microlenses, and emission intensity in a specific direction is increased. Consequently, it is possible to improve light utilization efficiency in the optical system.

When the microlenses 15 and the protective layer 14 are formed integrally with each other, the distance between the microlenses 15 and the light emitting elements 100 can be shortened, compared with when the microlenses 15 are formed on a separate substrate and bonded. Therefore, the three-dimensional angle of light that enters the microlenses from the light emitting layer is widened, and light extraction efficiency is thus improved.

Options of the method of manufacturing the microlenses 15 can be increased by separately creating and bonding together the microlenses 15 and the substrate 8 on which the light emitting elements 100 are disposed. Therefore, the degree of freedom of designing the microlenses 15 is increased.

Figure 7A:
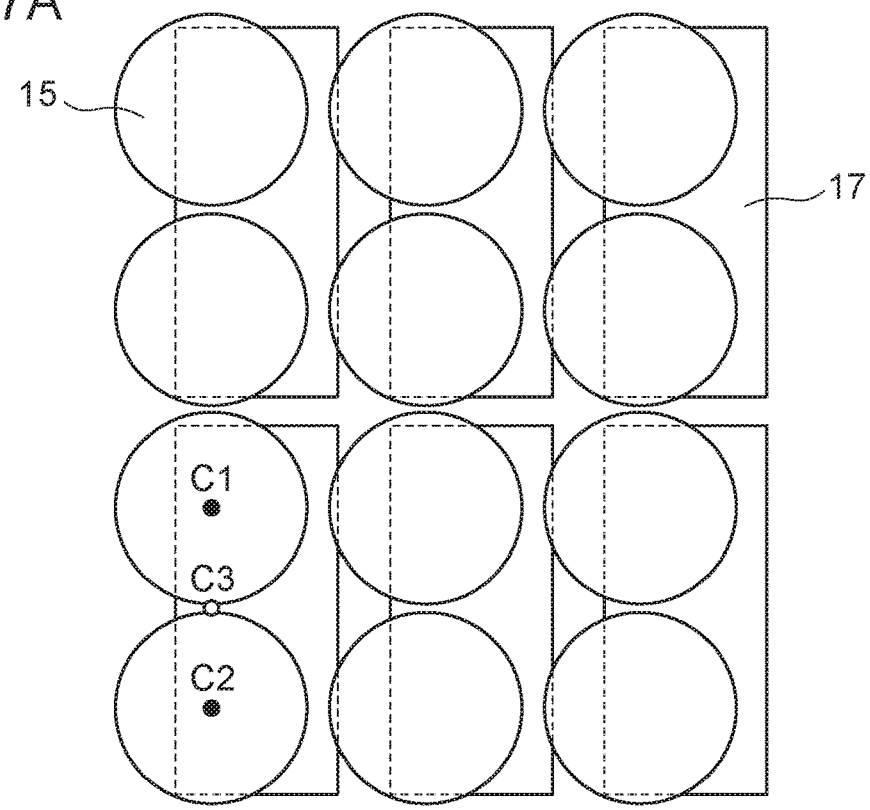
FIGS. 7A and 7B are planar schematic diagrams each illustrating an example of an arrangement of a light emitting device and microlenses.
Figure 7B:
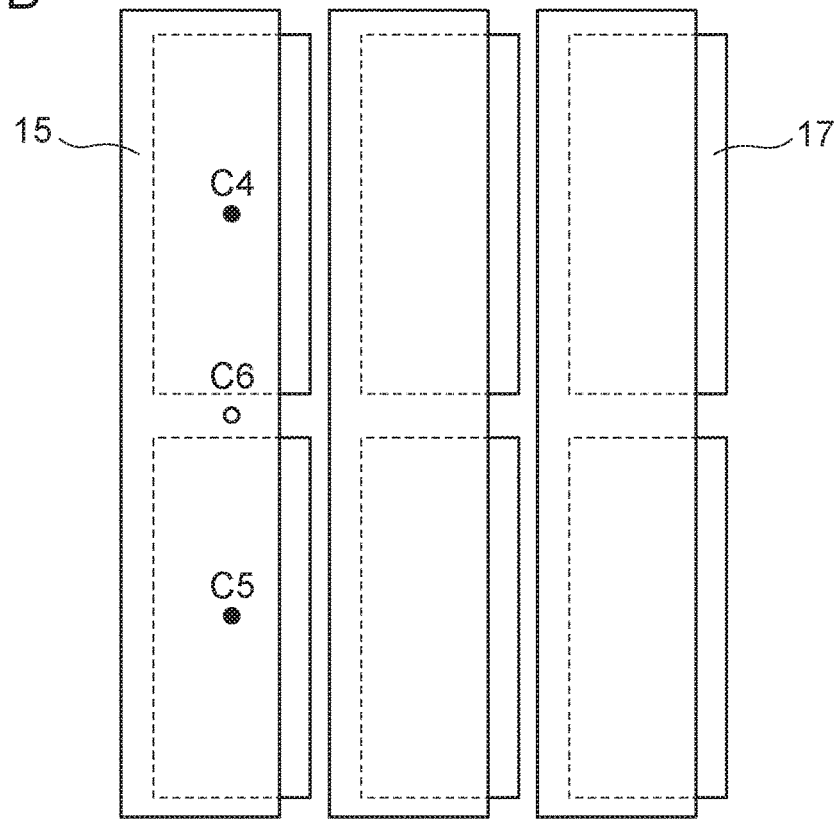

Next, arrangement examples of the microlenses 15 and the light-emission regions are presented. In FIGS. 3A and 3B, an example in which one microlens is disposed with respect to one light emitting element. However, as illustrated in FIG. 7A, a plurality of microlenses may be disposed with respect to one light emitting element. Alternatively, one microlens may be disposed with respect to a plurality of light emitting elements to be shared among the plurality of light emitting elements as illustrated in FIG. 7B. When a plurality of microlenses 15 are disposed with respect to one light-emission element 100, an intermediate point C3 between centers C1 and C2 of the microlenses 15 and the center of the light-emission region are at least away (shifted) from each other by a certain distance as illustrated in FIG. 7A.

When three or more of the microlenses 15 are disposed with respect to one light emitting element and if the centers of the microlenses 15 are not on a straight line, the center of gravity of a figure formed by connecting the centers of the microlenses and the center of the light-emission region is at least shifted from each other.

When one microlens is disposed with respect to a plurality of light emitting elements so as to be shared among the plurality of light emitting elements, an intermediate point C6 between centers C4 and C5 of the light-emission regions and the center of the microlens are at least shifted from each other as illustrated in FIG. 7B. When one microlens 15 is disposed to be shared among three or more of light emitting elements and if centers of the light-emission regions are not on a straight line, the center of gravity of a figure formed by connecting the centers of the light-emission regions and the center of the microlens 15 are at least shifted from each other. Here, the microlens may have a cylindrical shape.

Figure 8:
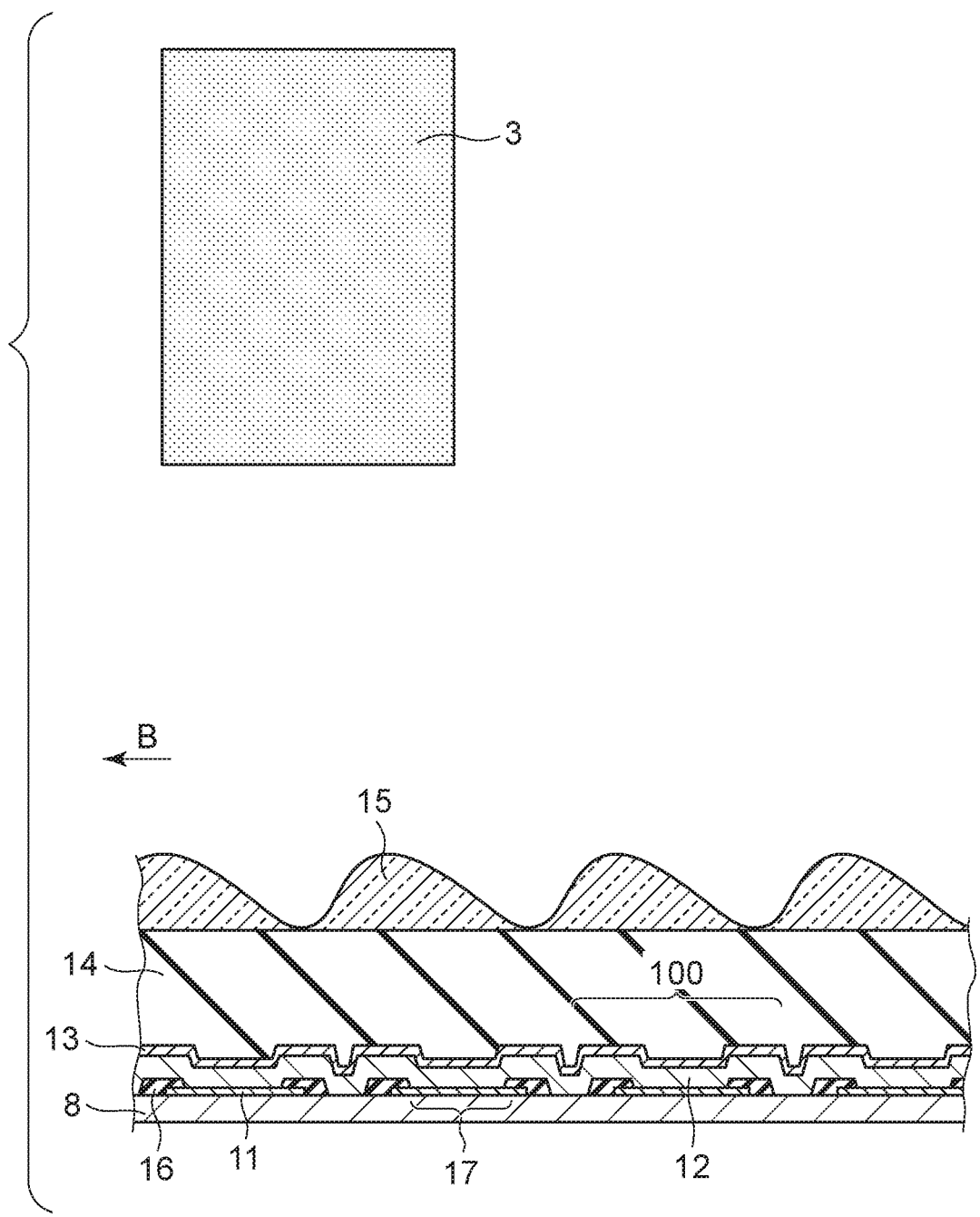
FIG. 8 is a sectional schematic diagram illustrating an example of aspherical lenses.

In the present embodiment, an example in which the microlenses 15 are spherical in a cross-section in the direction perpendicular to the main surface of the substrate 8 is presented. The shape of each microlens 15 is, however, not limited thereto. For example, as illustrated in FIG. 8, each microlens 15 may be an aspherical lens, in which the vertex of the microlens 15 is shifted from the center of the microlens 15 in the cross-section. Even in this case, it is possible to improve light utilization efficiency of the optical system by employing the configuration of the present embodiment and disposing the light-emission regions and the microlenses 15 so as to be shifted from each other.

In the present embodiment, the light emitting device that is applied to the exposure system has been described. The light emitting device is, however, not limited thereto. For example, the light emitting device may be a display device.

For example, in a display device, an imaging display device, or the like that uses the light emitting device in a magnification optical system as illustrated in FIG. 2, a light ray that travels in the front direction with respect to a display surface is utilized at a center portion of a function region (display region). In contrast, at a peripheral portion of the function region, light that travels in an oblique direction with respect to the display surface is utilized.

When a microlens is disposed to be shifted from a light-emission region as illustrated in FIG. 4B, as with the configuration of the present embodiment, light is refracted when being transmitted through the microlens, and emission intensity in a specific direction is increased. Therefore, it is possible to increase emission intensity of light that travels in the oblique direction with respect to the display surface by employing the configuration of the present embodiment at the peripheral portion of the function region. Consequently, it is possible to provide a display device and an imaging display device in each of which light utilization efficiency is improved.

Second Embodiment

A light emitting device according to the present embodiment will be described with reference to the drawings. In the present embodiment, an example in which the light emitting device is applied as a display device will be described. Specifically, an example of a display device that visually recognizes light that is emitted from the light emitting device through a magnification optical system will be described. Except that a microlens shift amount is different, a configuration similar to that of the first embodiment is usable as the configuration of the light emitting device of the present embodiment. Therefore, description of overlapping portions of the configuration is omitted.

Figure 9A:
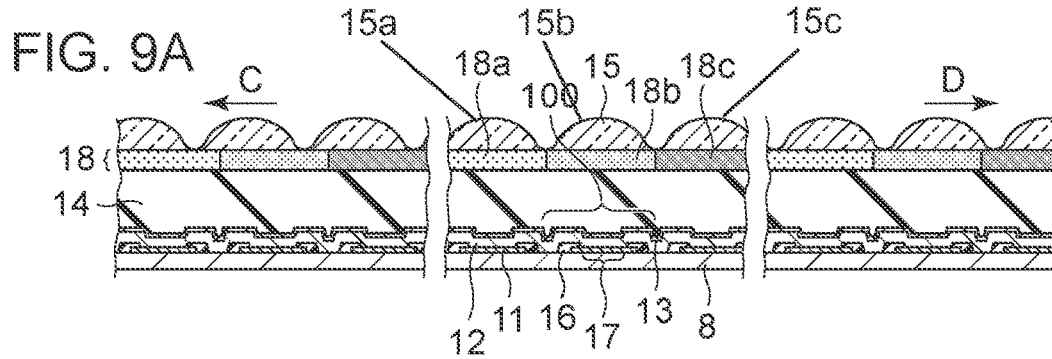
FIG. 9A is a sectional schematic diagram illustrating an example of a portion of a display device in which a light emitting device is used.
Figure 9B:
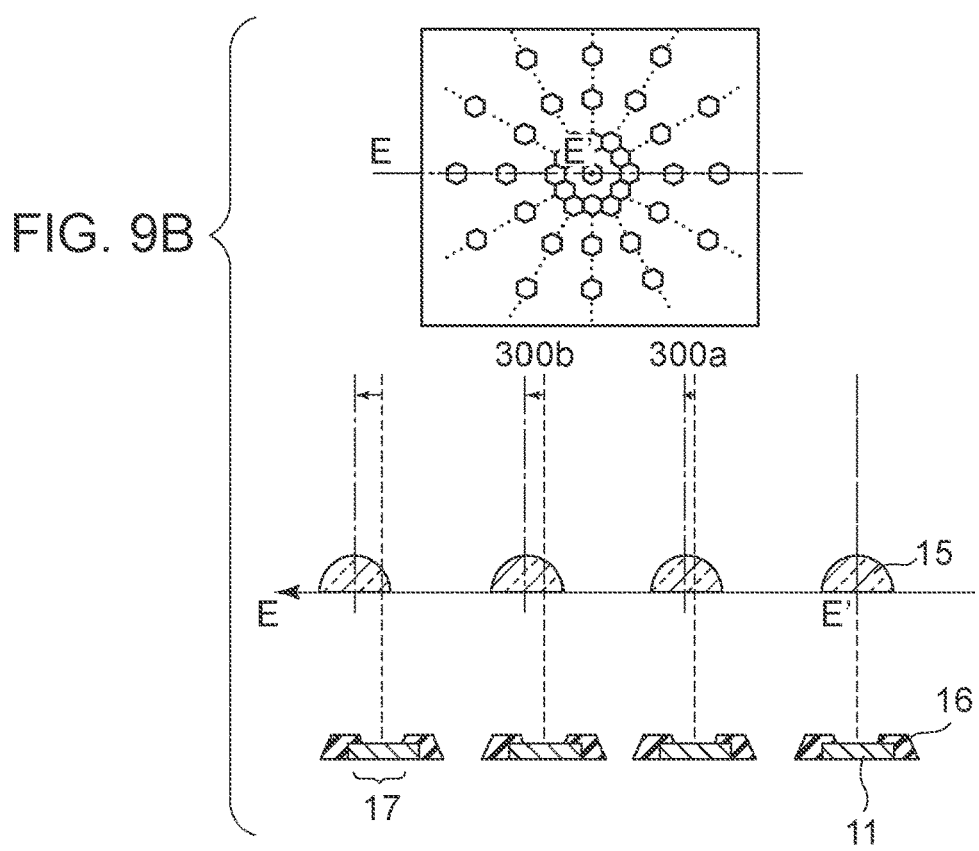
FIG. 9B is a schematic diagram for describing an arrangement of light emitting elements and microlenses.
Figure 9C:
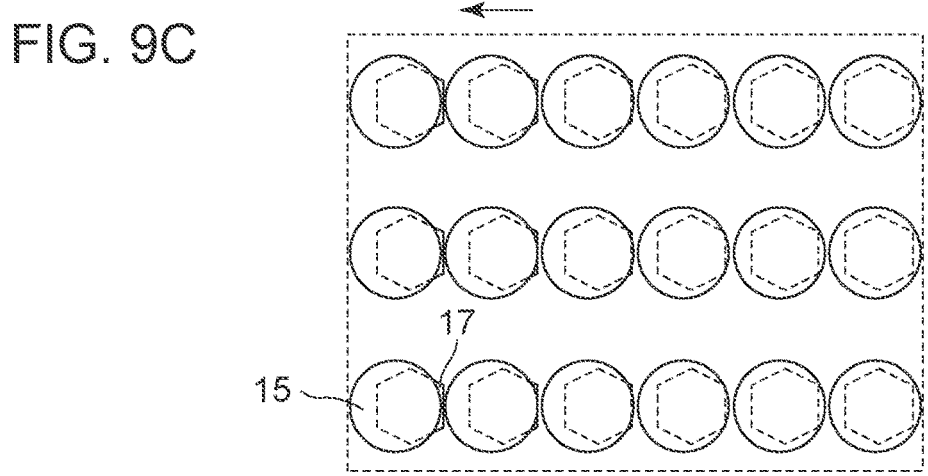
FIG. 9C is a planar schematic diagram illustrating an example of a portion of a display device in which a light emitting device is used.

FIG. 9A is a sectional diagram illustrating one embodiment of a portion of a display device in which the light emitting device of the present embodiment is used. FIG. 9B is a diagram for describing an arrangement of the light emitting elements 100 and the microlenses 15. FIG. 9C is a planar schematic diagram of a portion of the display device in which the light emitting device of the present embodiment is used.

In the present embodiment, the microlens 15 is disposed so as not to be shifted at a center portion of a display region (function region) with respect to the light-emission region 17. In other words, at the center portion of the display region, a distance between the center of the microlens 15 and the center of the light-emission region is substantially 0 (including errors in manufacture) in plan view with respect to the surface of the substrate 8 on which the light emitting elements 100 are disposed. Due to the sectional shape of the microlens 15 here being spherical, a distance between the vertex of the microlens 15 and the center of the light-emission region is also substantially 0 (coincident with each other).

In contrast, at the peripheral portion of the display region, the microlens 15 is disposed to be shifted to the outer side with respect to the light-emission region 17. In other words, at the peripheral portion of the display region, the center of the microlens 15 and the center of the light-emission region are away from (not coincident with) each other by a certain distance in plan view with respect to the surface of the substrate 8 on which the light emitting elements 100 are disposed. Due to the sectional shape of the microlens 15 here being spherical, the vertex of the microlens 15 and the center of the light-emission region are also away from each other by a certain distance.

In the present embodiment, the pitch (distance between the centers of mutually adjacent microlenses in plan view with respect to the surface of the substrate 8 on which the light emitting elements 100 are disposed) of the microlenses 15 is constant. The pitch (distance between the centers of the light-emission regions of the mutually adjacent light emitting elements 100 in the plan view) of the light emitting elements is also constant. The pitch of the microlenses 15 and the pitch of the light emitting elements 100 differ from each other. Therefore, even when the microlenses 15 and the light emitting elements 100 are disposed so as not to be shifted from each other at the center portion, the microlenses 15 and the light emitting elements 100 are disposed so as to be shifted from each other at the peripheral portion.

The display region (function region) is a region of the substrate 8 where the light emitting elements 100 are disposed. A drive circuit, a pad, and the like may be disposed at the periphery of the function region.

More specific configuration of the light emitting device according to the present embodiment will be described. The microlenses 15 are disposed to be shifted at the peripheral portion on the left side of the display region in the left direction (C direction) in FIG. 9A with respect to the light-emission regions and shifted in the right direction (D direction) regarding the light emitting elements at the peripheral portion on the right side of the display region. As illustrated in FIG. 9B, the centers of the microlens 15 and the light-emission region 17 are not shifted from each other at the position of a center portion E of the display region.

In contrast, at an adjacent pixel adjacent to a pixel at the center portion E' in a direction toward a peripheral portion E of the display region, the microlens 15 is disposed to be shifted from the center of the light-emission region 17 by a distance 300*a*. At a pixel adjacent to the aforementioned adjacent pixel in the direction toward the peripheral portion E of the display region, the center of the microlens 15 is disposed to be shifted from the center of the light-emission region 17 by a distance 300*b*. In other words, in the function region, a light emitting element at which a distance (shift) between the center of the light-emission region and the center of the microlens is smaller is disposed closer to the center side.

In a display device, an imaging display device, or the like that uses the light emitting device in a magnification optical system, a light ray that travels in the front direction with respect to a display surface is utilized at a center portion of a function region (display region). In contrast, light that travels in an oblique direction with respect to the display surface is utilized at the peripheral portion of the function region.

Therefore, by employing the configuration of the present embodiment, emission intensity of light that is transmitted through the microlenses 15 in a specific direction is increased at the peripheral portion of the function region. It is thus possible to increase, at the peripheral portion of the function region, emission intensity of light that travels in an oblique direction with respect to the display surface. Consequently, it is possible to provide a display device and an imaging display device in each of which light utilization efficiency is improved.

For example, the display device of the present embodiment includes a plurality of sets of a light-emission region and a microlens that light from the light-emission region enters. In this case, in the plurality of sets, a direction from the center of the light-emission region toward the vertex of the microlens in a direction parallel to the surface of the substrate 8 on which the light emitting elements 100 are disposed is a direction from a center portion of the function region in which the plurality of sets are disposed toward the peripheral portion thereof. Consequently, at the peripheral portion of the function region, it is possible to increase emission intensity in the peripheral direction of light that is transmitted through the microlenses 15, that is, light that travels in an oblique direction with respect to the display surface. Therefore, it is possible to provide a display device and an imaging display device in each of which light utilization efficiency is improved.

In the present embodiment, full color displaying may be enabled by employing a configuration in which the light emitting elements emit light of colors different from each other. As a method of realizing full color displaying, a method that uses, as described above, a white organic EL element and a color filter may be used, or a configuration that emits different colors by patterning a light emitting layer at each of the light emitting elements may be employed.

The full color displaying may be also enabled by varying, for each light emitting element, the distance between the first reflection surface and the second reflection surface previously described. By employing the configuration in which the distance between the first reflection surface and the second reflection surface is varied, light of different colors is emitted while the light emitting layer is shared among the light emitting elements, and the manufacturing process of the light emitting layer is facilitated, compared with when the method in which the light emitting layer is patterned is used.

The planar array when a plurality of the light emitting elements 100 are arranged may be any method among a stripe array, a square array, a delta array, a pentile array, and a bayer array. FIGS. 9A to 9C each illustrate an array example of a delta array. The size and the shape of each microlens 15 may be set, as appropriate, in accordance with the arraying method. For example, when a stripe array is employed, a plurality of long microlenses may be arranged over a plurality of pixels as illustrated in FIG. 7A, or a plurality of hemispherical microlenses may be disposed in one pixel as illustrated in FIG. 7B.

In the present embodiment, the color filter 18 may be disposed on the protective layer 14. Color filters 18*a*, 18*b*, and 18*c* may be color filters that transmit light of colors different from each other and may be, for example, color filters that transmit red light, green light, and blue right, respectively. In FIG. 9A, the color filter 18 is disposed between the protective layer 14 and the microlenses 15.

As with the first embodiment, the light emitting device of the present embodiment satisfies the following relation for, among the pixels that emit light of the same color (for example, green), three pixels disposed adjacent to each other in plan view with respect to the surface of the substrate 8 on which the light emitting elements 100 are disposed. In the plan view, the distance X between the center of the light-emission region and the vertex of the microlens is larger than a difference between a distance between the vertex of the microlens 15*a* and the vertex of the microlens 15*b* and a distance between the vertex of the microlens 15*b* and the vertex of the microlens 15*c*. The pitch of the microlenses 15 is constant in FIG. 9A. The center of the light-emission region and the center (vertex, here) of the microlens are thus disposed to be shifted from each other.

Therefore, it is possible to increase emission intensity in a specific direction, and it is possible to improve light utilization efficiency in the optical system.

Although only pixels at which the microlenses 15 each corresponding to one pixel overlap the center of the light-emission region of the pixel in plan view are illustrated, the light emitting device is not limited thereto. The aforementioned pixels such as those illustrated in FIG. 9A may be disposed in the whole region of the function region (display region). At the peripheral portion of the function region, pixels at which microlenses 15 each corresponding to one pixel do not overlap the center of the light-emission region of the pixel may be disposed. Having such a configuration, when light (oblique light) having a large angle at which the light travels from the center side of the function region toward the peripheral portion thereof is intended to be utilized, it is possible to improve utilization efficiency of the oblique light.

Figure 10A:
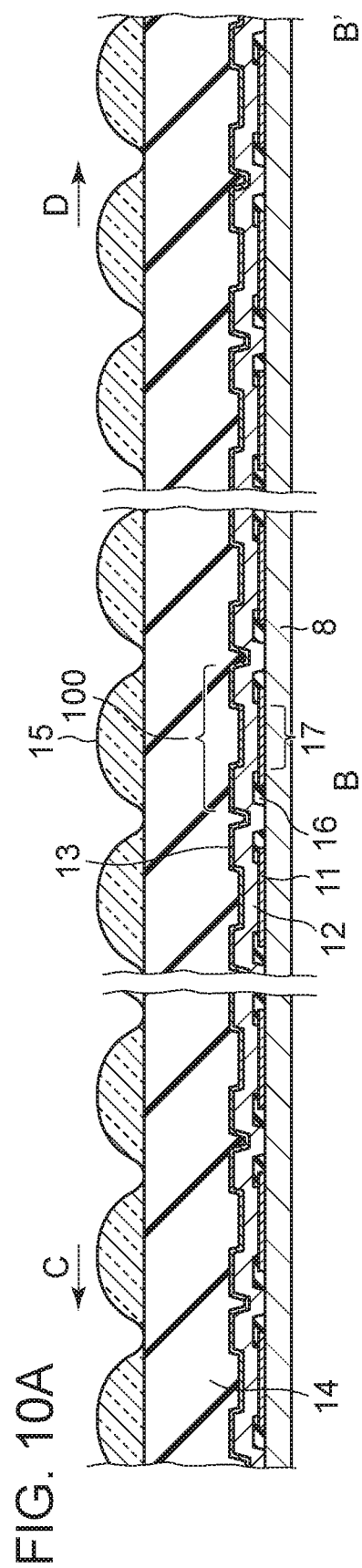
FIGS. 10A to 10C are sectional schematic diagrams each illustrating a configuration example of an exposure system without a color filter.

In the present embodiment, an example in which full color displaying is possible by using a color filter that transmits light of three colors is presented; however, the embodiment is not limited thereto. A portion or the entirety of the color filter 18 may be omitted. FIG. 10A illustrates an example in which the color filter is omitted. In this case, the light emitting device may be a light emitting device that emits white light with the light emitting elements 100 as white-light emission elements. Color displaying may be performed by forming the light emitting layers of the light emitting elements 100 separately to vary the colors of light emitted from the light emitting elements.

The layered order of the color filter and the microlenses may be selected, as appropriate. FIG. 9 illustrates an example in which microlenses are disposed on the light extraction side with respect to the color filter. As a result of the color filter and the microlenses being layered in this order, light that enters the microlenses can be only light that has passed through the color filter, and emission of adjacent pixels to the outside of elements of unintended colors can be suppressed. Thus, display quality can be improved.

A distance (color-filter shift amount) between the center of the color filter 18 of each pixel and the center of the light-emission region in plan view can be set, as appropriate. Considering an optical path along which light from the light-emission region reaches the microlenses by passing through the color filter 18, it is considered that setting the color-filter shift amount in the range of 0 or more and less than or equal to the microlens shift amount as illustrated in FIG. 9A can cause transmission of light not to be easily obstructed.

The color filter may be formed, as illustrated in FIG. 9A, on the protective layer 14 integrally therewith and further formed integrally with the microlenses or may be formed on a separate substrate and bonded so as to face the microlens. Forming the color filter 18 and the protective layer 14 integrally with each other enables the color filter to be formed with respect to the light-emission region with high positional accuracy by using a photolithography process. Forming the color filter 18, the microlenses 15, and the protective layer 14 integrally with each other enables the positional relation among the light-emission regions, the color filter 18, and the microlenses 15 to be formed with accuracy.

Figure 11:
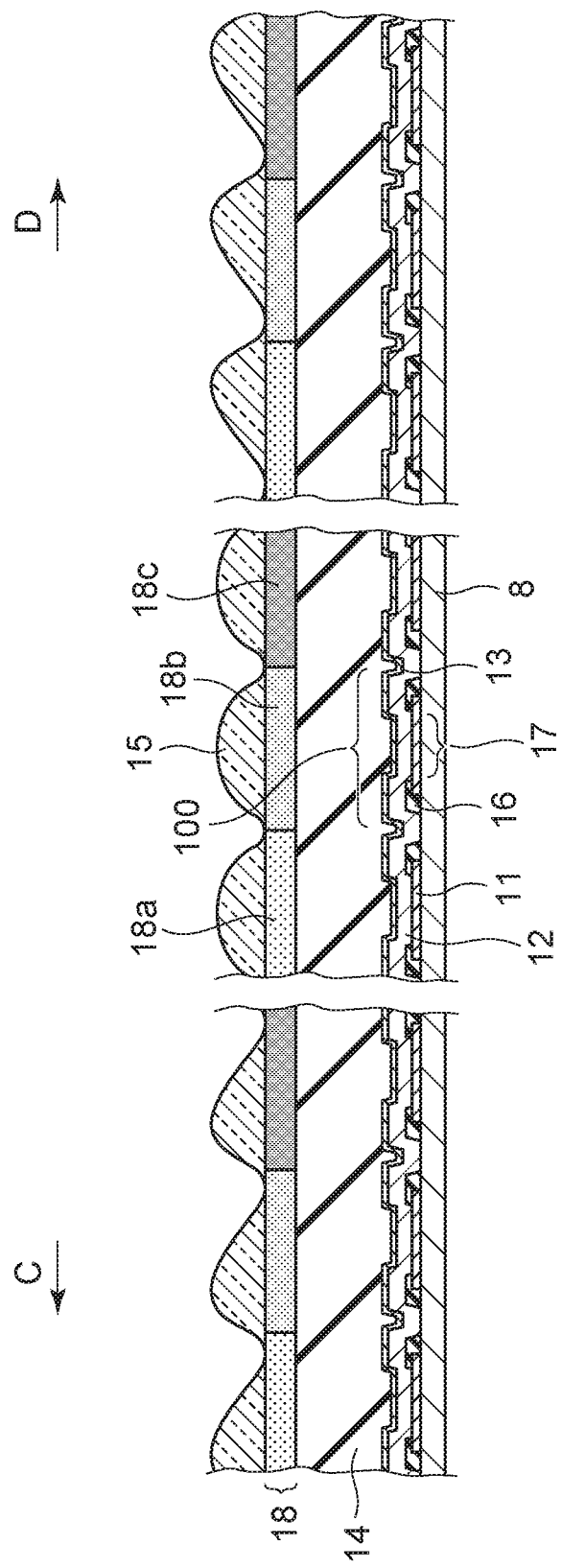
FIG. 11 is a sectional schematic diagram for describing an example in which aspherical lenses are used in a light emitting device.

In the present embodiment, an example in which the microlenses 15 are spherical microlenses has been described. The light emitting device of the present embodiment is, however, not limited thereto. For example, as illustrated in FIG. 11, an aspherical lens in which the center and the vertex of the lens are shifted from each other may be used. FIG. 11 illustrates an example in which, in the function region of the display device, the microlenses 15 of pixels at the center portion are spherical lenses and the microlenses 15 of pixels at the periphery (peripheral portion) thereof are aspherical lenses. Even in this case, by using the light emitting device of the present embodiment, it is possible at the peripheral portion to increase emission intensity of light emitted obliquely from the pixels. Consequently, it is possible to improve light utilization efficiency in the optical system.

Figure 10B:
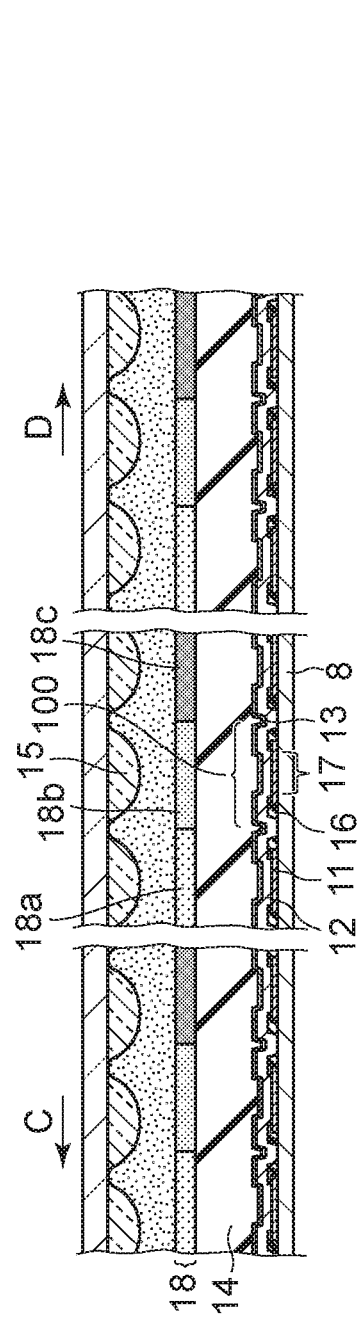
Figure 10C:
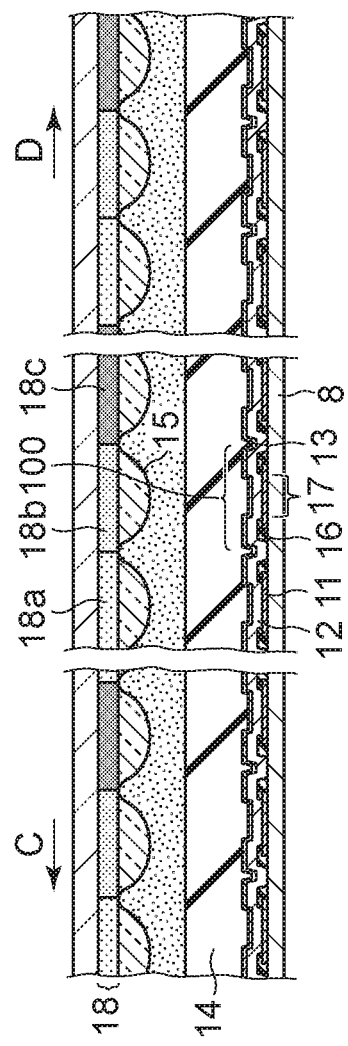

A configuration in which, as illustrated in FIG. 10B, the microlenses 15 are formed on a separate substrate and bonded may be employed. Forming the microlenses 15 by using a substrate separate from the substrate 8 that includes the light emitting elements 100 increases the degree of freedom of the processing method (temperature and the like) in the preparation of the microlenses 15 and increases the degree of freedom of designing the microlenses 15. The light emitting device may be created as illustrated in FIG. 10C by forming the microlenses 15 and the color filter 18 on a separate substrate and bonding the microlens 15 and the color filter 18 to the substrate 8 that includes the light emitting elements 100. Such a configuration can increase the degree of freedom of designing in formation of the color filter 18 and the microlenses 15.

In this case, as with the first embodiment, the microlenses 15 and the color filter 18 are fixed to the substrate 8 by an adhesive. Details are the same as those in the first embodiment, and description thereof is thus omitted.

Although an example of the display device has been described above, the application example of the light emitting device of the present embodiment is not limited thereto. For example, the light emitting device may be applied to an exposure system. The sectional view of a portion of the light emitting device of the exposure system in the present embodiment is similar to B-B' in FIG. 10A. The image-forming lens array 3 is disposed thereto as illustrated in FIG. 3A. The schematic diagram of a portion of the function region of the light emitting device in FIG. 10A in plan view is similar to that in FIG. 10C.

The present embodiment employs a configuration in which the microlens shift amount of light emitting elements increases as the distance from a location directly below the image-forming lens array increases. The microlens shift amount of each light emitting element can be set in accordance with an angle at which light travels from each light emitting element toward the image-forming lens array. Therefore, employing the configuration of the present embodiment can improve light utilization efficiency, as with the first embodiment.

Third Embodiment

Configuration of Organic Light Emitting Element

An organic light emitting element is provided by forming an anode, an organic compound layer, a cathode on a substrate. A protective layer, a color filter, and the like may be disposed on the cathode. When a color filter is disposed, a flattening layer may be disposed between the color filter and a protective layer. The flattening layer can be constituted by an acrylic resin or the like.

Substrate

As the substrate, there are presented quartz, glass, silicon wafers, resins, metals, and the like. On the substrate, a switching element, such as a transistor or the like, and wiring may be provided, and an insulating layer may be provided thereon. Regarding the insulating layer, the material thereof is not limited, provided that it is possible to form a contact hole in the insulating layer to ensure conduction between an anode 2 and wiring and that it is possible to ensure insulation between the insulation layer and wiring that is not intended to be connected to the insulating layer. For example, resins of polyimide and the like, silicon oxides, and silicon nitrides are usable.

Electrode

As electrodes, a pair of electrodes are usable. The pair of electrodes may be an anode and a cathode. When an electric field is applied in a direction in which the organic light emitting element emits light, an electrode having a higher potential is the anode, and the other is the cathode. It can be said that an electrode that supplies holes to the light emitting layer is the anode and an electrode that supplies electrons is the cathode.

As the constituent material of the anode, a material having a work function that is as large as possible can be used. For example, metal simple substances of gold, platinum, silver, copper, nickel, palladium, cobalt, selenium, vanadium, tungsten, and the like or mixtures thereof, and alloys in which these metal simple substances are combined are usable. For example, metal oxides of tin oxide, zinc oxide, indium oxide, indium tin oxide (ITO), indium zinc oxide, and the like are also usable. Further, conductive polymers of polyaniline, polypyrrole, polythiophene, and the like are also usable.

One type of these electrode substances may be used individually, or two types or more of these electrode substances may be used in combination. The anode may be constituted by one layer or may be constituted by a plurality of layers.

When the electrodes are used as reflecting electrodes, for example, chromium, aluminum, silver, titanium, tungsten, and molybdenum or alloys thereof, and these that are layered are usable. When the electrodes are used as transparent electrodes, oxide transparent conductive layers of indium tin oxide (ITO), indium zinc oxide, and the like are usable; however, the electrodes are not limited thereto. To form the electrodes, a photolithography technique is usable.

As the constituent material of the cathode, a material having a small work function can be used. For example, there are presented alkali metals, such as lithium and the like, alkaline earth metals, such as calcium and the like, metal simple substances of aluminum, titanium, manganese, silver, lead, chromium, and the like or mixtures containing these metal simple substances. Alternatively, alloys in which these metal simple substances are combined are also usable. For example, magnesium-silver, aluminum-lithium, aluminum-magnesium, silver-copper, zinc-silver, and the like are usable. It is also possible to utilize metal oxides, such as indium tin oxide (ITO) and the like. One type of these electrode substances may be used individually, or two types or more of these electrode substances may be used in combination. The cathode may have a single-layer configuration or may have a multilayer configuration. In particular, silver can be used. To suppress aggregation of silver, a silver alloy can be used. The ratio of the alloy is not limited provided that it is possible to suppress aggregation of silver. For example, the ratio may be 1:1.

The cathode is not particularly limited. The cathode may be a top emission element with use of an oxide conductive layer of ITO or the like and may be a bottom emission element with use of a reflecting electrode of aluminum (Al) or the like. The method of forming the cathode is not particularly limited. When DC and AC sputtering methods and the like are used, coverage of films can be excellent, and resistance can be easily reduced.

Protective Layer

A protective layer may be disposed on the cathode. For example, by bonding glass that is provided with a moisture absorbent onto the cathode, it is possible to suppress infiltration of water and the like with respect to the organic compound layer and suppress occurrence of display defects. As another embodiment, infiltration of water and the like with respect to the organic EL layer may be suppressed by disposing a passivation film of silicon nitride or the like on the cathode. For example, after the cathode is formed, the cathode may be transported to another chamber without breaking the vacuum, and a silicon nitride film having a thickness of 2 μm may be formed as a protective layer by a CVD method. A protective layer for which an atomic layer deposition method (ALD method) has been used after the film formation by the CVD method may be disposed.

Color Filter

A color filter may be disposed on the protective layer. For example, a color filter considering the size of the organic light emitting element may be disposed on a separate substrate, and the color filter and a substrate on which an organic light emitting element is disposed may be bonded to each other. Alternatively, a color filter may be patterned on the aforementioned protective layer by using a photolithography technique. The color filter may be constituted by polymers.

Flattening Layer

A flattening layer may be disposed between the color filter and the protective layer. Although the flattening layer may be constituted by an organic compound or may be low molecular or high molecular, the flattening layer can be high molecular.

Flattening layers may be disposed above and below the color filter. The constituent materials of the flattening layers may be the same or different. Specifically, there are presented a polyvinyl carbazole resin, a polycarbonate resin, a polyester resin, an ABS resin, an acrylic resin, a polyimide resin, a phenolic resin, an epoxy resin, a silicon resin, a urea resin, and the like.

Counter Substrate

A counter substrate may be provided on the flattening layer. The counter substrate is disposed at a location corresponding to the aforementioned substrate and thus is called a counter substrate. The constituent material of the counter substrate may be the same as that of the aforementioned substrate.

Organic Layer

The organic compound layer (a hole-injection layer, a hole-transport layer, an electron blocking layer, a light emitting layer, a hole blocking layer, an electron transport layer, an electron injection layer, and the like) that constitutes the organic light emitting element according to one embodiment is formed by the following method.

For the organic compound layer that constitutes the organic light emitting element according to one embodiment, a vacuum evaporation method, an ionized evaporation method, and a dry process of sputtering, plasma, or the like may be usable. As an alternative to the dry process, a wet process in which an organic compound is dissolved in a suitable solvent and a layer is formed by a publicly known coating method (for example, spin coating, dipping, casting methods, a LB method, an inkjet method, or the like) is also usable.

When a layer is formed by the vacuum evaporation method, the solution coating method, or the like, crystallization and the like do not easily occur, and the layer is thus excellent in stability with time. When forming a film by the coating method, it is possible to form a film in combination with a suitable binder resin.

As the aforementioned binder resin, there are presented a polyvinyl carbazole resin, a polycarbonate resin, a polyester resin, an ABS resin, an acrylic resin, a polyimide resin, a phenolic resin, an epoxy resin, a silicon resin, a urea resin, and the like. The aforementioned resins are examples, and the binder resin is not limited thereto.

One type of these binder resins may be used individually as a homopolymer or a copolymer, or two types or more of these binder resins may be used by being mixed together. Further, as necessary, a publicly known additive, such as a plasticizer, an antioxidant, and an ultraviolet absorber, may be used in combination.

Intended Use of Light Emitting Device

The light emitting device according to the first embodiment or the second embodiment is usable as a display part of various types of electronic devices. For example, there are presented a digital camera, a video camera, a head-mounted display (goggle-type display), a game machine, a car navigation, a personal computer, a portable information terminal, an electronic book, a TV receiver, and the like. Specific examples will be described below with reference to the drawings.

Figure 12A:
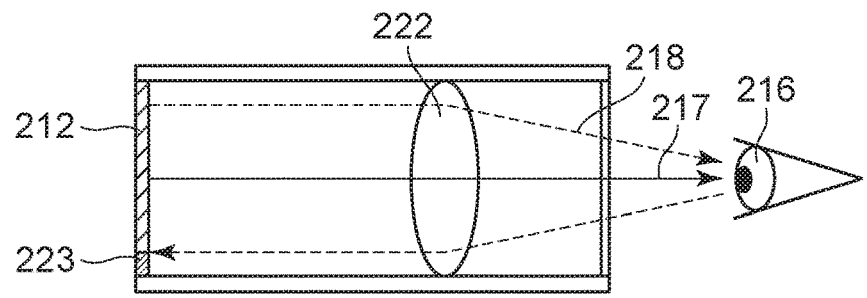
FIGS. 12A to 12C are schematic diagrams each illustrating an application example of a light emitting device.
Figure 12B:
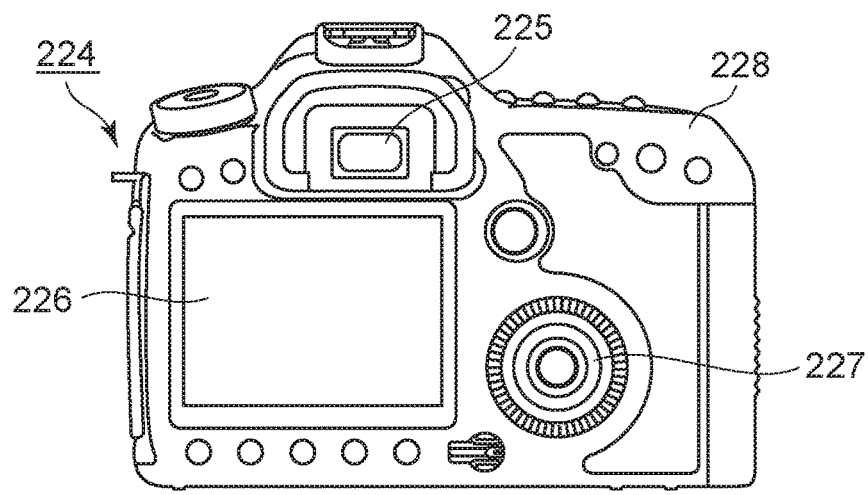
Figure 12C:
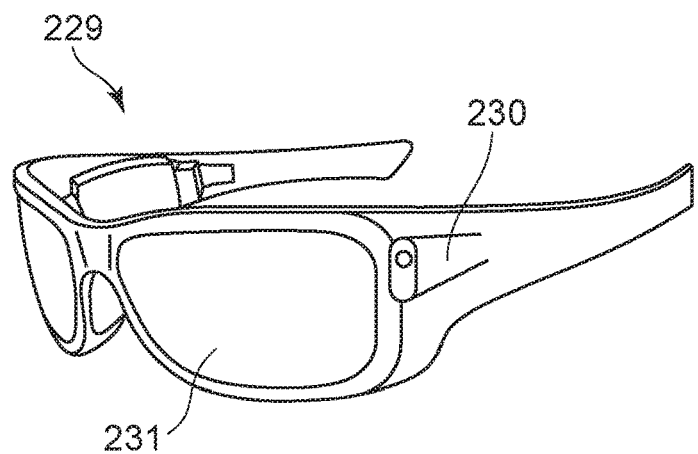

FIGS. 12A to 12C are examples of the application example as a display device of a semiconductor device. A display device in which the light emitting device according to the first embodiment or the second embodiment is used is applicable to information display devices, such as a view finder of a camera, a head-mounted display, and smart glasses.

FIG. 12A is a diagram of the general configuration of an example in which the light emitting device is used as a view finder of an imaging device of a camera or the like. Display light 217 and infrared light 218 are emitted from a display device 212. The display light and the infrared light reach eyeballs 216 of a user through an identical optical member 222. The infrared light that has been reflected by the eyeballs 216 of the user is converted into electrical information by an imaging device 223 that includes an imaging element. On the basis of the information, a line of sight is detected. Instead of disposing the imaging device, an imaging element may be disposed on an insulating layer of the display device 212 and used as an imaging display device.

FIG. 12B illustrates an example of an imaging device of a camera or the like. An imaging device 224 includes a view finder 225, a display 226, an operation part 227, and a housing 228. The display device in FIG. 12A is disposed in the view finder 225.

Although, in FIG. 12A, an example in which the display light 217 and the infrared light 218 pass through the identical optical member 222 is presented, separate optical members may be disposed for the display light and the infrared light. Instead of disposing the imaging device, an imaging element may be disposed on a substrate of the display device 212 and used as an imaging display device. Detected line-of-sight information is usable in control of the display device or various equipment connected to the display device, that is, usable for example in focus control of a camera, resolution control of a display image, and as an alternative to a button operation.

The display device that includes the light emitting device according to the present embodiment may include an imaging device that includes a light receiving element, and may control a display image of the display device on the basis of line-of-sight information of a user from the imaging device.

Specifically, in the display device, a first visual-field region to be watched by a user and a second visual-field region other than the first visual-field region are determined on the basis of line-of-sight information. The first visual-field region and the second visual-field region may be determined by a control unit of the display device, or those that are determined by an external control unit may be received. In a display region of the display device, the display resolution of the first visual-field region may be controlled to be higher than the display resolution of the second visual-field region. In other words, the resolution of the second visual-field region may be set to be lower than the resolution of the first visual-field region.

The display region includes a first display region and a second display region that differs from the first display region. On the basis of line-of-sight information, a high-priority region is determined between the first display region and the second display region. The first visual-field region and the second visual-field region may be determined by the control unit of the display device, or those that are determined by an external control unit may be received. The resolution of the high-priority region may be controlled to be higher than the resolution of a region other than the high-priority region. In other words, the resolution of a region having a relatively low priority may be set to be low.

Artificial intelligence (AI) may be used to determine the first visual-field region and the high-priority region. The AI may be of a model configured to use as teacher data an image of eyeballs and a direction actually viewed by the eyeballs in the image and estimate, from the image of the eyeballs, an angle of a line of sight and a distance to an object in the direction of the line of sight. An AI program may be included in the display device, may be included in the imaging device, or may be included in an external device. When the AI program is included in an external device, determined regions are transmitted to the display device via communication.

When display control is performed on the basis of visually recognized detection, the display can be applied to smart glasses that further include an imaging device that images the outside. The smart glasses are capable of displaying imaged outside information in real time.

In addition, a first imaging device that includes a light receiving element that receives infrared light, and a second imaging device that includes a light receiving element different from that of the first imaging device and that is for imaging the outside may be included, and on the basis of line-of-sight information of a user of the first imaging device, the imaging resolution of the second imaging device may be controlled. The information amount can be reduced by reducing, compared with a region for which resolution of imaging is prioritized, the resolution of other regions. Therefore, it is possible to reduce power consumption and reduce a display delay. The prioritized region may be set as a first imaging region, and a region having lower priority than the first imaging region may be set as a second imaging region.

FIG. 12C is a schematic diagram illustrating an example of smart glasses. An imaging display device 229, which is represented by smart glasses, includes a control portion 230, a transparent display portion 231, and an outside imaging portion (not illustrated). In application in smart glasses, it is possible to control both the display device and the outside imaging portion on the basis of detected line-of-sight information and reduce power consumption and a display delay. For example, by reducing the resolution of displaying and imaging of, among display regions, a region other than a region watched by a user, it is possible to reduce the information amounts of both imaging and displaying and reduce power consumption and a display delay.

The display device that includes the light emitting device according to the first embodiment or the second embodiment is usable as a constituent member of the following display device and a lighting device. In addition, the intended use includes an exposure light source of an electrophotographic image forming device, a backlight of a liquid crystal display device, a light emitting device that includes a color filter in a white light source, and the like.

The display device may include an image input portion for inputting image information that is from an area CCD, a linear CCD, a memory card, and the like and may be an image information processing device that includes an information processor configured to process inputted information and that displays an inputted image on a display part.

A display part included in an imaging device or an inkjet printer may have a touch-panel function. The drive system of the touch-panel function is not particularly limited and may be an infrared system, a capacitive system, a resistive film system, or an electromagnetic induction system. The display device may be used in a display part of a multifunction printer.

Figure 13:
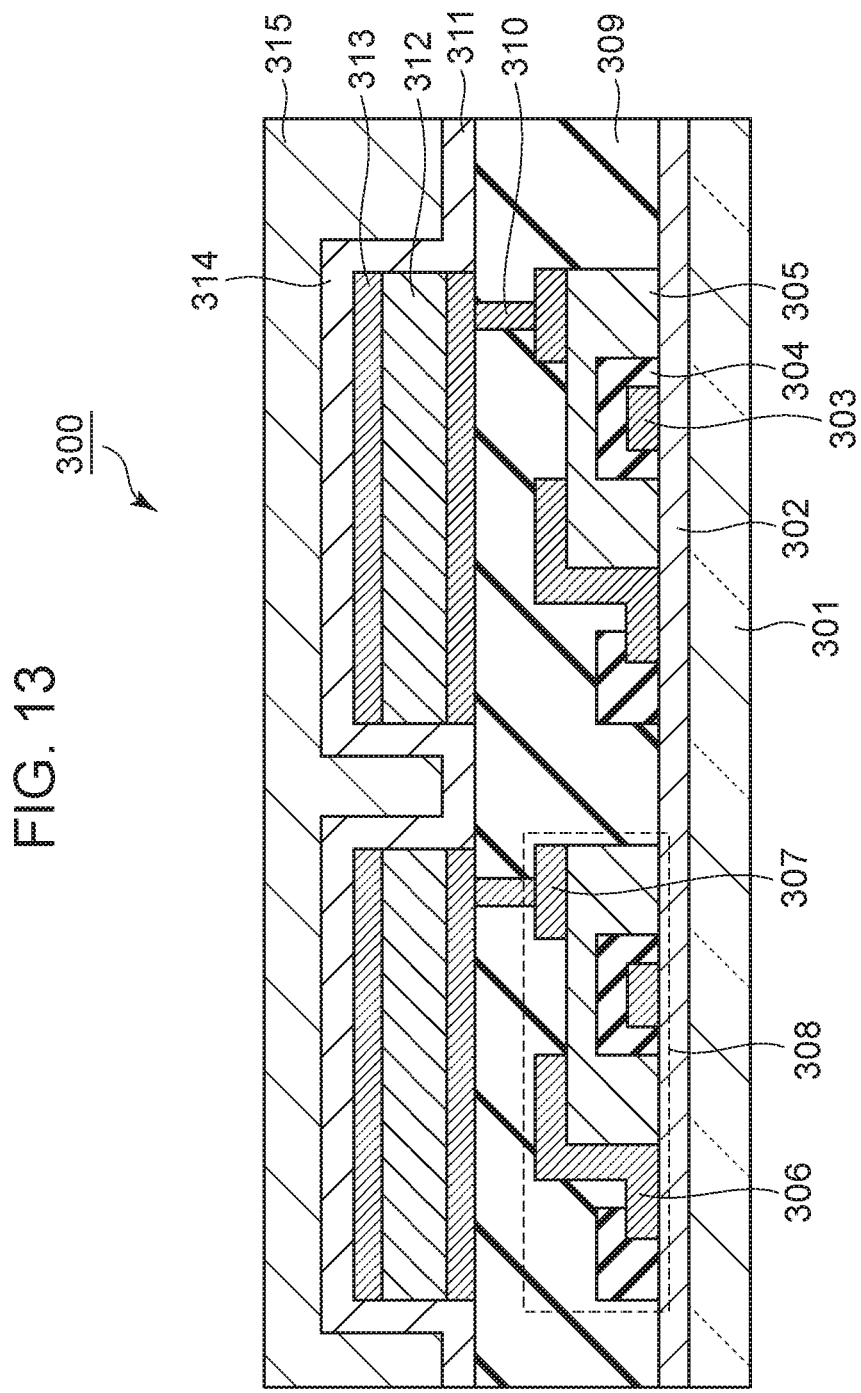
FIG. 13 is a schematic sectional diagram of an example of an imaging display device.

Next, the display device according to the present embodiment will be described with reference to the drawings. FIG. 13 is a sectional schematic diagram illustrating an example of the display device including an organic light emitting element and a TFT element connected to the organic light emitting element. The TFT element is an example of an active element.

A display device 300 in FIG. 13 includes a substrate 301 of glass or the like and, on an upper portion thereof, a moisture-proof film 302 for protecting a TFT element or an organic compound layer. The sign 303 denotes a metal gate electrode 303. The sign 304 denotes a gate insulating film 304. The sign 305 denotes a semiconductor layer 305.

A TFT element 308 includes the semiconductor layer 305, a drain electrode 306, and a source electrode 307. An insulating film 309 is disposed on an upper portion of the TFT element 308. An anode 311 and the source electrode 307 that constitute the organic light emitting element are connected to each other via a contact hole 310.

The method of electrical connection between electrodes (the anode and the cathode) included in the organic light emitting element and electrodes (the source electrode and the drain electrode) included in the TFT is not limited to the form illustrated in FIG. 13. In other words, one of the anode and the cathode and one of the TFT element source electrode and the drain electrode are at least electrically connected to each other.

In the display device 300 in FIG. 13, the organic compound layer is illustrated as a single layer. The organic compound layer 312 may be, however, a plurality of layers. A first protective layer 314 and a second protective layer 315 that are for suppressing deterioration of the organic light emitting element are disposed on a cathode 313.

In the display device 300 of FIG. 13, a transistor is used as a switching element; however, instead of the transistor, a MIM element may be used as a switching element.

The transistor used in the display device 300 of FIG. 13 is not limited to a transistor in which a single crystal silicon wafer is used and may be a thin-film transistor that includes an active layer on an insulating surface of a substrate. As the active layer, there are presented single crystal silicon, non-single crystal silicon, such as amorphous silicon and microcrystalline silicon, and non-single crystal oxide semiconductor of indium zinc oxide, indium gallium zinc oxide, and the like. The thin film transistor is also called a TFT element.

The transistor included in the display device 300 of FIG. 13 may be formed in a substrate, such as a Si substrate. Here, forming in a substrate means producing a transistor by processing the substrate, such as a Si substrate, itself. In other words, including the transistor in the substrate can be considered that the substrate and the transistor are integrally formed.

In the organic light emitting element according to the present embodiment, emission luminance is controlled by a TFT, which is an example of the switching element, and by disposing the organic light emitting elements on a plurality of faces, it is enabled to display an image with respective emission luminance. The switching element according to the present embodiment is not limited to the TFT and may be a transistor formed of a low-temperature polysilicon or an active matrix driver formed on a substrate, such as a Si substrate. Being formed on the substrate can be said being formed in the substrate. Whether to dispose a transistor in a substrate or to use a TFT is selected in accordance with the size of a display part. For example, when the size is approximately 0.5 inch, the organic light emitting element can be disposed on a Si substrate.

Figure 14:
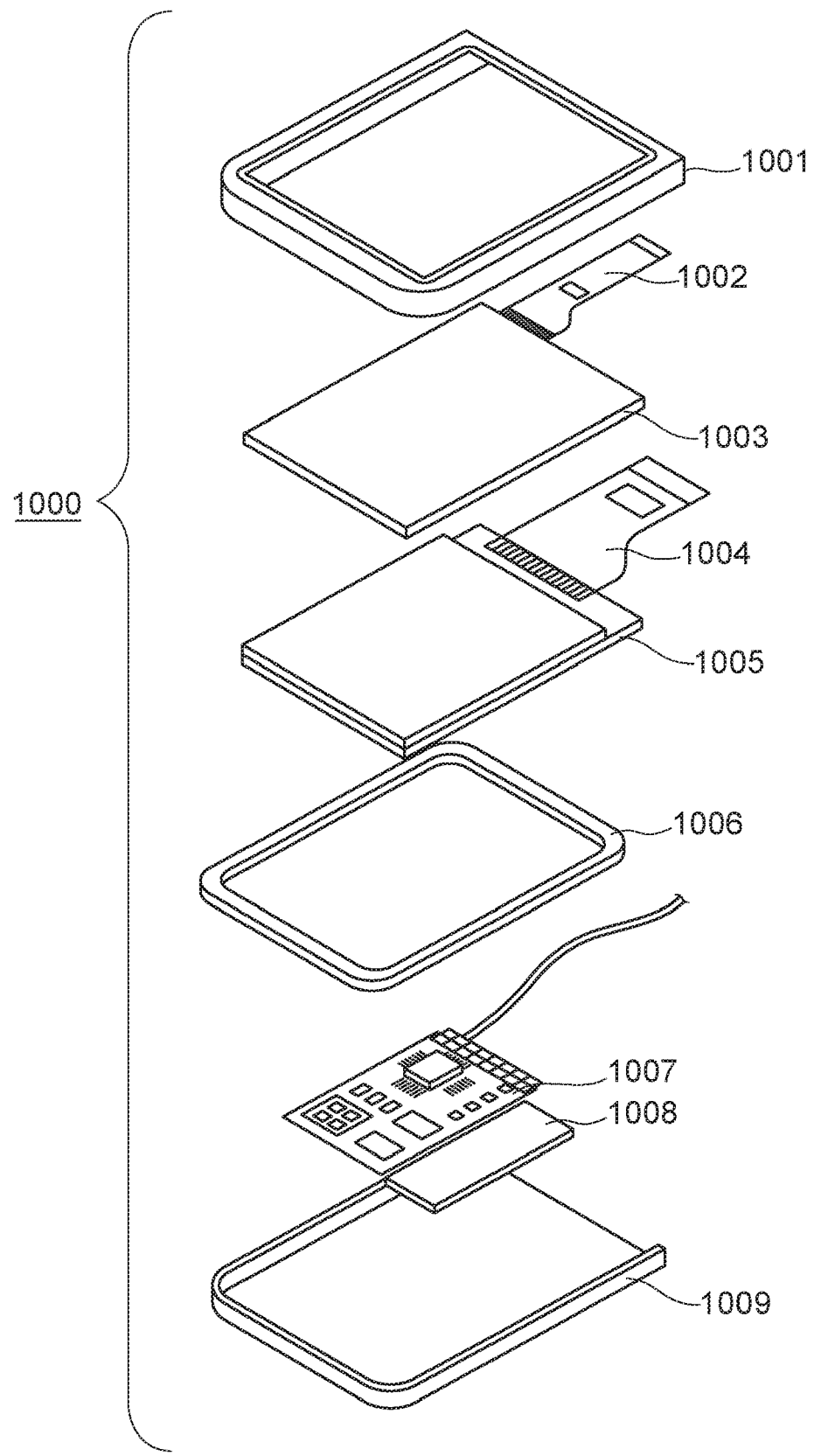
FIG. 14 is a schematic sectional diagram of an example of a display device.

FIG. 14 is a schematic diagram illustrating an example of the display device according to the present embodiment. A display device 1000 may include, between an upper cover 1001 and a lower cover 1009, a touch panel 1003, a display panel 1005, a frame 1006, a circuit substrate 1007, and a battery 1008. Flexible printed circuits (FPC) 1002 and 1004 are connected to the touch panel 1003 and the display panel 1005, respectively. A transistor is printed on the circuit substrate 1007. The battery 1008 is not necessarily included when the display device is not a portable device. Even when the display device is a portable device, the battery 1008 may be included in another location.

The display device 1000 according to the present embodiment may be used in a display part of a photoelectric conversion device including an optical part that includes a plurality of lenses and an imaging element that receives light that has passed through the optical part. The photoelectric conversion device may include a display part that displays information obtained by the imaging element. The display part may be configured to obtain information by using the information obtained by the imaging element and display information that differs from the information obtained by the imaging element. The display part may be a display part exposed to the outside of the photoelectric conversion device or may be a display part disposed in a finder. The photoelectric conversion device may be a digital camera or a digital video camera.

Figure 15A:
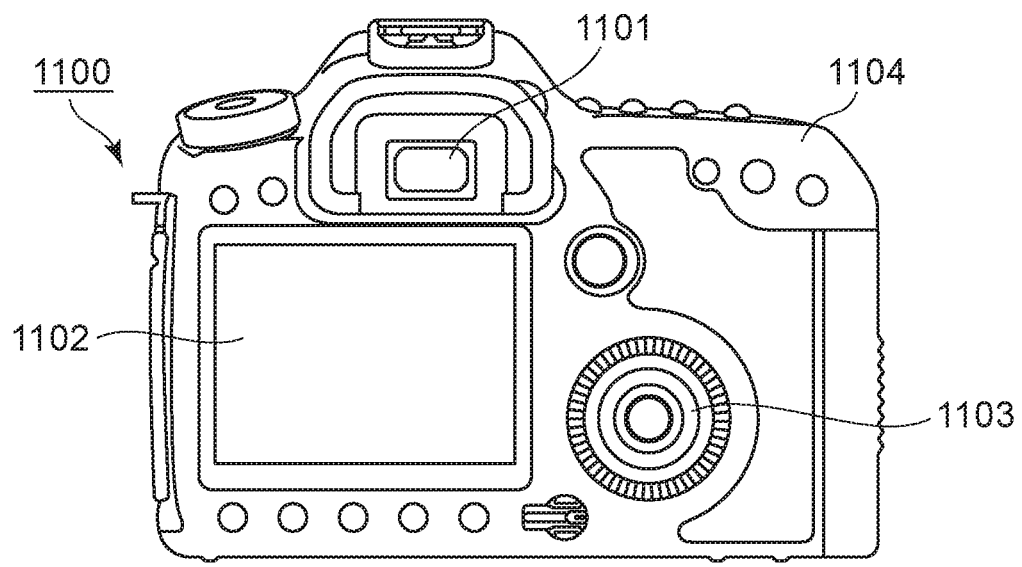
FIG. 15A is a schematic diagram illustrating an example of a photoelectric conversion device.

FIG. 15A is a schematic diagram illustrating an example of the photoelectric conversion device (imaging device) according to the present embodiment. A photoelectric conversion device 1100 may include a view finder 1101, a rear display 1102, an operation part 1103, and a housing 1104. The view finder 1101 may include, as a display device, the light emitting device according to the first embodiment or the second embodiment. In that case, the display device may display not only an imaged image but also environmental information, imaging instruction, and the like. The environmental information may include the intensity of external light, the direction of the external light, the moving speed of a subject, a possibility of the subject being shielded by a shielding object, and the like.

Since a period suitable for imaging is short, it is desirable that information be displayed as soon as possible. Therefore, the display device in which the organic light emitting element according to the present disclosure is used can be used. This is because the response of the organic light emitting element is fast. A display device in which the organic light emitting element is used is more suitably usable in these devices, for which display speed is required, than in a liquid crystal display device.

The photoelectric conversion device 1100 includes an optical part (not illustrated). The optical part includes a plurality of lenses and forms an image on an imaging element housed in the housing 1104. The plurality of lenses are capable of adjusting the focus by adjusting the relative position thereof. This operation can be automatically performed.

The display device according to the present embodiment may include a color filter having a red color, a green color, and a blue color. In the color filter, the red color, the green color, and the blue color may be arranged in a delta array.

The display device according to the present embodiment may be used in a display part of a portable terminal. In that case, the display may have both a display function and an operation function. As the portable terminal, in addition to a mobile phone, such as a smartphone, and a tablet, there are presented a head-mounted display, which has been previously described, and the like.

Figure 15B:
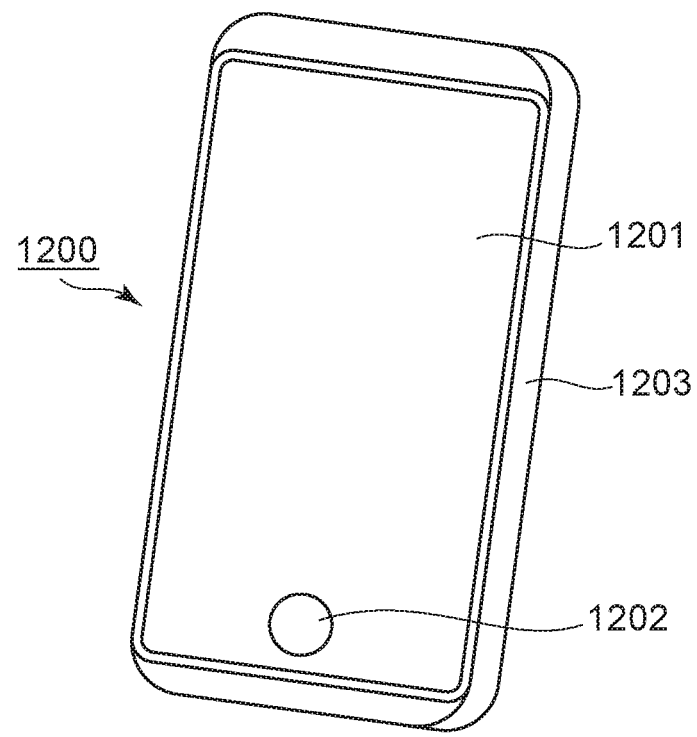
FIG. 15B is a schematic diagram illustrating an example of an electronic device.

FIG. 15B is a schematic diagram illustrating an example of the electronic device according to the present embodiment. An electronic device 1200 includes a display part 1201, an operation part 1202, and a housing 1203. The housing 1203 may include a circuit, a printed substrate including the circuit, a battery, and a communication part. The operation part 1202 may be a button or a reaction part of a touch-panel method. The operation part may be a biological recognition part that performs unlocking and the like by recognizing a fingerprint. The electronic device that includes the communication part can be said to be a communication equipment. The display part can include the light emitting device according to the first embodiment or the second embodiment.

Figure 16A:
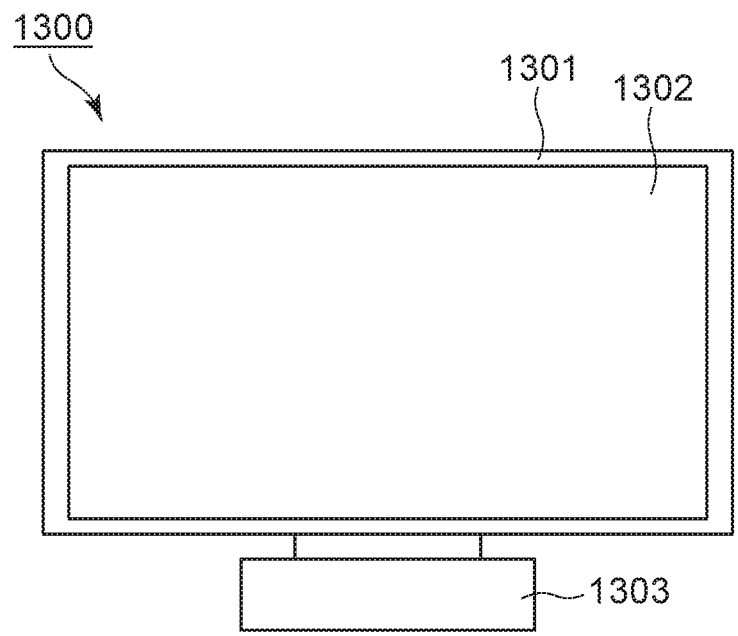
FIG. 16A is a schematic diagram illustrating an example of a display device.
Figure 16B:
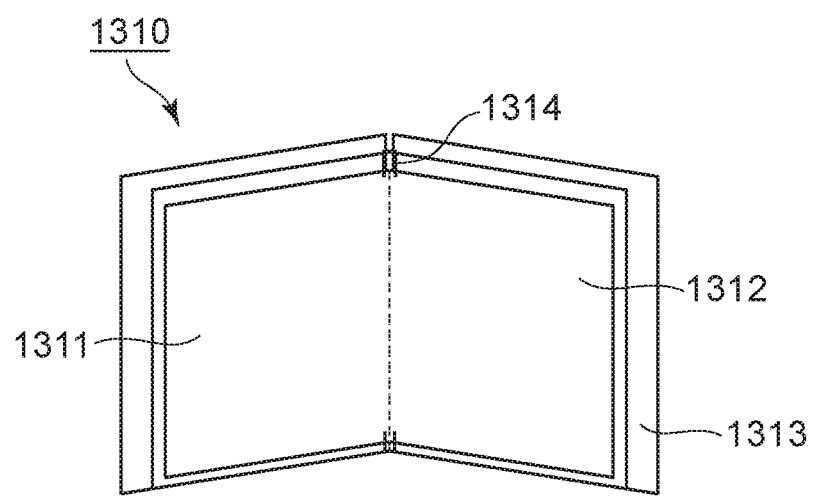
FIG. 16B is a schematic diagram illustrating an example of a foldable display device.

FIGS. 16A and 16B are schematic diagrams each illustrating an example of the display device that includes the light emitting device according to the present embodiment. FIG. 16A illustrates a display device of a television monitor, a PC monitor, or the like. A display 1300 includes a frame 1301 and includes a display part 1302. In the display part 1302, the light emitting device according to the first embodiment or the second embodiment may be used.

A base 1303 that supports the frame 1301 and the display part 1302 is included. The base 1303 is not limited by the form in FIG. 16A. The lower side of the frame 1301 may function as a base.

The frame 1301 and the display part 1302 may be bent. The radius of curvature may be 5000 mm or more and 6000 mm or less.

FIG. 16B is a schematic diagram illustrating another example of the display device that includes the light emitting device according to the present embodiment. A display device 1310 in FIG. 16B is configured to be foldable and is commonly known as a foldable display device. The display device 1310 includes a first display part 1311, a second display part 1312, a housing 1313, and a bending point 1314. The first display part 1311 and the second display part 1312 may include the semiconductor device according to the present embodiment. The first display part 1311 and the second display part 1312 may be a single display device without a joint. The first display part 1311 and the second display part 1312 can be divided at the bending point 1314. The first display part 1311 and the second display part 1312 may display mutually different images, or one image may be displayed by the first and second display parts.

Figure 17A:
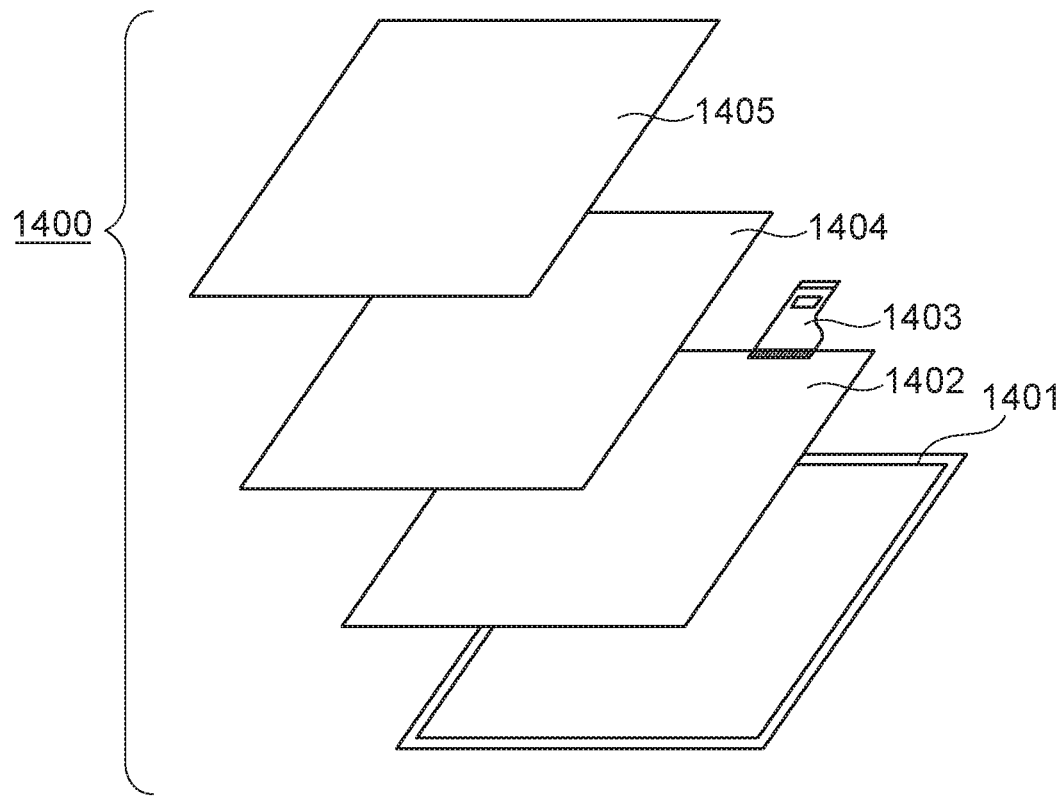
FIG. 17A is a schematic diagram illustrating an example of a lighting device.

FIG. 17A is a schematic diagram illustrating an example of the lighting device according to the present embodiment. A lighting device 1400 may include a housing 1401, a light source 1402, a circuit substrate 1403, an optical film 1404, and a light diffusion part 1405. The light source may include the light emitting device according to the first embodiment or the second embodiment. In this case, image data that is input into each pixel may be a signal corresponding to the same luminance instead of being image data that forms an image when displayed.

The optical film 1404 may be a filter that improves color rendering of the light source. The light diffusion part 1405 is capable of effectively diffusing, for example lighting up, light of the light source and delivering the light to a wide range. The optical filter and the light diffusion part may have permeability and may be disposed on the light emission side of lighting. As necessary, a cover may be disposed at an outermost portion.

The lighting device 1400 is, for example, a device for lighting a room. The lighting device may emit light having, in addition to white and daylight white, any colors including blue to red. A dimming circuit for dimming them may be included. The lighting device 1400 may include the light emitting device according to the first embodiment or the second embodiment and may include, for example, an organic light emitting element and a power source circuit connected thereto. The power source circuit is a circuit that converts an AC voltage into a DC voltage. White means that the color temperature is 4200 K, and daylight white means that the color temperature is 5000 K. The lighting device may include a color filter.

The lighting device 1400 according to the present embodiment may include a heat dissipation part. The heat dissipation part dissipates heat in a device to the outside of the device. As the heat dissipation part, there are presented a high-specific heat metal, liquid silicon, and the like.

Figure 17B:
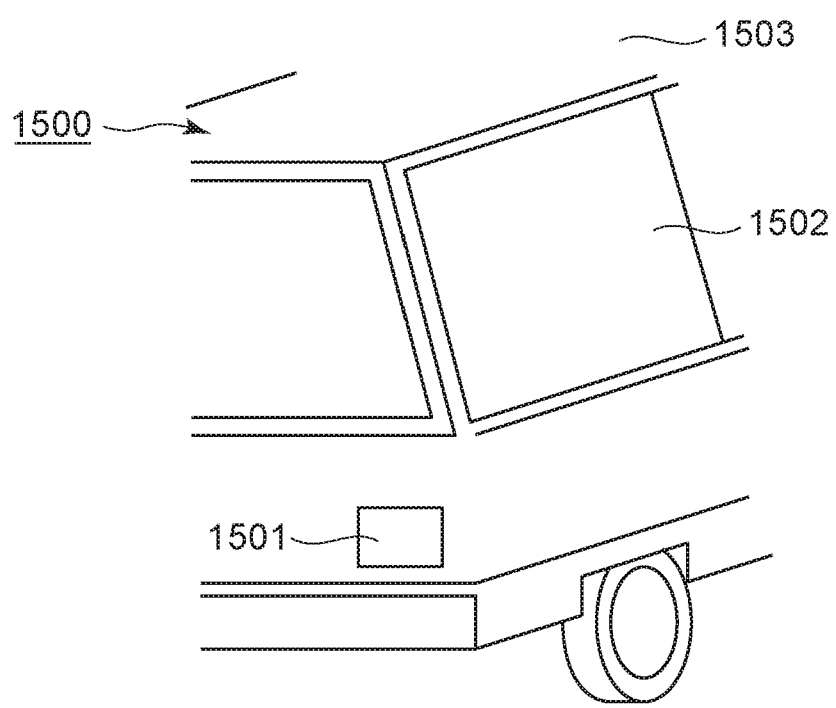
FIG. 17B is a schematic diagram illustrating an example of an automobile with a vehicle-use lighting appliance.

FIG. 17B is a schematic diagram of an automobile, which is an example of the moving object according to the present embodiment. The automobile includes a tail lamp, which is an example of a lighting appliance. An automobile 1500 may include a tail lamp 1501 and have a form of lighting the tail lamp when a brake operation or the like is performed.

The tail lamp 1501 may include, as a lighting device, the light emitting device according to the first embodiment or the second embodiment. The tail lamp may include a protective member that protects an organic EL element. Although the material of the protective member is not limited as long as having a certain degree of high strength and being transparent, the protective member can be constituted by polycarbonate and the like. A furandicarboxylic acid derivative, an acrylonitrile derivative, or the like may be mixed in the polycarbonate.

The automobile 1500 may include a body 1503 and a window 1502 attached thereto. The window may be a transparent display as long as not being a window for confirming front and rear of the automobile. The transparent display may include the light emitting device according to the first embodiment or the second embodiment. In this case, constituent materials of electrodes and the like included in the organic light emitting element are constituted by transparent members.

The moving object according to the present embodiment may be a ship, an aircraft, a drone, and the like. The moving object may include a body and a lighting appliance disposed on the body. The lighting appliance may perform light emission for notifying the position of the body. The lighting appliance includes, as a light emitting device, the lighting device according to the first embodiment or the second embodiment.

As described above, by employing the light emitting device according to the first embodiment or the second embodiment, it is possible to provide a device having a wide angle of visibility and improved light utilization efficiency.

It is possible to provide a light emitting device in which light utilization efficiency is improved.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-033820, filed Feb. 28, 2020 and Japanese Patent Application No. 2019-130386, filed Jul. 12, 2019 which are hereby incorporated by reference herein in their entirety.

What is claimed is:

1. A light emitting device comprising:
a first light emitting element and a second light emitting element disposed on a main surface of a substrate;
a first lens that is fixed to the substrate and that overlaps a center of a first light-emission region of the first light emitting element in a plan view in a direction perpendicular to the main surface; and
a second lens that overlaps a center of a second light-emission region of the second light emitting element in the plan view in the direction perpendicular to the main surface,
wherein, in the plan view in the direction perpendicular to the main surface, a distance from the center of the first light-emission region to a center of the first lens is a first distance in a first direction parallel to the main surface,
wherein, in the plan view in the direction perpendicular to the main surface, a distance from the center of the second light-emission region to a center of the second lens is a second distance in a same direction as the first direction,
wherein a direction from the center of the first light-emission region to the center of the second light-emission region is perpendicular to the first direction, and
wherein the direction from the center of the first light-emission region to the center of the first lens is parallel to the direction from the center of the second light-emission region to the center of the second lens.

2. The light emitting device according to claim 1, wherein, in the plan view, the center of the first lens is a center of gravity of an outer shape of the first lens.

3. The light emitting device according to claim 1, wherein, in the plan view in the direction perpendicular to the main surface, a distance between the center of the second light-emission region and a center of the second lens is the same as the first distance in the first direction parallel to the main surface.

4. The light emitting device according to claim 3, wherein, in the first direction parallel to the main surface, a distance between the center of the first lens and the center of the second lens and a distance between the center of the first light-emission region and the center of the second light-emission region are different from each other.

5. The light emitting device according to claim 3, further comprising:
a plurality of sets of a light-emission region and a lens that light from the light-emission region enters, the plurality of sets including a set of the first light-emission region and the first lens and a set of the second light-emission region and the second lens,
wherein, in each of the plurality of sets, a direction from a center of the light-emission region toward a center of the lens in a direction parallel to the main surface is a direction from a center portion of a region in which the plurality of sets is disposed toward a peripheral portion thereof.

6. The light emitting device according to claim 3, further comprising:
a function region in which a plurality of light emitting elements including the first light emitting element and the second light emitting element are disposed,
wherein, the second light emitting element is positioned on a center side of the function region with respect to the first light emitting element.

7. The light emitting device according to claim 1,
wherein the first light emitting element includes
a first electrode disposed on the main surface,
an organic layer disposed on the first electrode and including a light emitting layer, and
a second electrode disposed on the first electrode with the organic layer held between the first electrode and the second electrode,
wherein an insulating layer that covers an end of the first electrode and that has an opening on the first electrode is disposed, and
wherein, in the plan view, the first light-emission region is a portion where the first electrode, the light emitting layer, and the second electrode are layered on each other at the opening of the insulating layer.

8. The light emitting device according to claim 1,
wherein an insulating layer is disposed on the first light emitting element, and
wherein the first lens is disposed in contact with the insulating layer.

9. The light emitting device according to claim 1,
wherein an insulating layer is disposed on the first light emitting element, and
wherein a space is present between the first lens and the insulating layer.

10. The light emitting device according to claim 1, wherein a color filter is disposed between the first light emitting element and the first lens.

11. The light emitting device according to claim 1, wherein a color filter is disposed on the first lens.

12. An exposure system comprising:
the light emitting device according to claim 1; and
a photoreceptor,
wherein the exposure system is configured such that the photoreceptor is irradiated with light emitted from the light emitting device.

13. An imaging display device comprising:
an imaging device; and
as a display part, the light emitting device according to claim 1,
wherein a display image of the display part is controlled based on line-of-sight information of a user from the imaging device.

14. An imaging device comprising:
an optical part including a plurality of lenses;
an imaging element that receives light that has passed through the optical part; and
a display part that displays an image imaged by the imaging element,
wherein the display part includes the light emitting device according to claim 1.

15. An electronic device comprising:
a display part including the light emitting device according to claim 1;
a housing in which the display part is disposed; and a communication part that is disposed in the housing and communicates with an outside.

16. A lighting device comprising:
a light source including the light emitting device according to claim 1; and
a light diffusion part or an optical film that transmits light emitted by the light source.

17. The light emitting device according to claim 1, further comprises:
a third light emitting element disposed on the main surface of the substrate; and
a third lens that overlaps a center of a third light-emission region of the third light emitting element in the plan view in the direction perpendicular to the main surface,
wherein, in the plan view in the direction perpendicular to the main surface, a distance from the center of the third light-emission region to a center of the third lens is a third distance in the first direction parallel to the main surface, and
wherein the third distance is larger than the first distance.

18. The light emitting device according to claim 1, further comprising:
a plurality of light emitting elements including the first light emitting element and the second light emitting element; and
a plurality of lenses which including the first lens and the second lens and which corresponding to the plurality of the light emitting elements,
wherein in the plan view in the direction perpendicular to the main surface, each of centers of all of the plurality of lenses is located at a position in the first direction from a center of a light-emission region of a corresponding light emitting element of the plurality of light emitting elements.

19. The light emitting device according to claim 18, further comprising:
an image-forming lens array disposed above the plurality of light emitting elements,
wherein in the plan view in the direction perpendicular to the main surface, a center of the image-forming lens array in the first direction is shifted in the first direction from a center of a function region in which the plurality of light emitting elements are disposed.

20. The light emitting device according to claim 19, further comprising: a plurality of function regions including the function region,
wherein the plurality of function regions include a first function region and a second function region, and
wherein in the plan view in the direction perpendicular to the main surface, the first direction in the first function region is opposite to the first direction in the second function region.

21. The light emitting device according to claim 20, wherein, in the plan view in the direction perpendicular to the main surface, the first function region and the second function region are disposed adjacent to each other in a direction perpendicular to the first direction.

22. The light emitting device according to claim 1,
wherein in the plan view in the direction perpendicular to the main surface, the first lens is disposed at a position of the first distance in the first direction from the center of the first light-emission region, and
wherein in the plan view in the direction perpendicular to the main surface, the second lens is disposed at a position of the second distance in the first direction from the center of the second light-emission region.

* * * * *